(12) United States Patent
Acar

(10) Patent No.: US 9,278,845 B2
(45) Date of Patent: Mar. 8, 2016

(54) MEMS MULTI-AXIS GYROSCOPE Z-AXIS ELECTRODE STRUCTURE

(71) Applicant: Fairchild Semiconductor Corporation, San Jose, CA (US)

(72) Inventor: Cenk Acar, Irvine, CA (US)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 342 days.

(21) Appl. No.: 13/755,953

(22) Filed: Jan. 31, 2013

(65) Prior Publication Data

US 2013/0139592 A1    Jun. 6, 2013

Related U.S. Application Data

(63) Continuation-in-part of application No. 13/813,443, filed as application No. PCT/US2011/052006 on Sep. 16, 2011.

(60) Provisional application No. 61/384,247, filed on Sep. 18, 2010, provisional application No. 61/384,512, filed on Sep. 20, 2010, provisional application No. 61/593,691, filed on Feb. 1, 2012.

(51) Int. Cl.
   *G01C 19/56* (2012.01)
   *B81B 3/00* (2006.01)
   (Continued)

(52) U.S. Cl.
   CPC .............. *B81B 3/0018* (2013.01); *B81B 3/0059* (2013.01); *B81C 1/00134* (2013.01); *G01C 19/56* (2013.01); *G01C 19/5712* (2013.01);
   (Continued)

(58) Field of Classification Search
   CPC ............... G01C 19/5712; G01C 19/56; G01C 19/5607; G01C 19/5649; G01C 19/5642; G01C 19/5663; G01C 19/5656; G01P 15/125; G01P 15/08; G01P 15/18
   USPC ............... 73/504.12, 504.14, 504.16, 504.04, 73/514.32
   See application file for complete search history.

(56) References Cited

U.S. PATENT DOCUMENTS

| 3,231,729 A | 1/1966 | Stern |
| 4,896,156 A | 1/1990 | Garverick |
| 5,481,914 A | 1/1996 | Ward |

(Continued)

FOREIGN PATENT DOCUMENTS

| CN | 1068444 A | 1/1993 |
| CN | 1198587 A | 11/1998 |

(Continued)

OTHER PUBLICATIONS

"U.S. Appl. No. 12/849,742, Notice of Allowance mailed Nov. 29, 2013", 7 pgs.

(Continued)

*Primary Examiner* — Helen Kwok
(74) *Attorney, Agent, or Firm* — Schwegman Lundberg & Woessner, P.A.

(57) ABSTRACT

Various examples include microelectromechanical die for sensing motion that includes symmetrical proof-mass electrodes interdigitated with asymmetrical stator electrodes. Some of these examples include electrodes that are curved around an axis orthogonal to the plane in which the electrodes are disposed. An example provides vertical flexures coupling an inner gimbal to a proof-mass in a manner permitting flexure around a horizontal axis.

15 Claims, 23 Drawing Sheets

(51) Int. Cl.
 *G01C 19/5712* (2012.01)
 *B81C 1/00* (2006.01)

(52) U.S. Cl.
 CPC . *B81B2201/0242* (2013.01); *B81B 2203/0154* (2013.01)

(56) References Cited

U.S. PATENT DOCUMENTS

| | | | |
|---|---|---|---|
| 5,487,305 A | 1/1996 | Ristic et al. | |
| 5,491,604 A | 2/1996 | Nguyen et al. | |
| 5,600,064 A | 2/1997 | Ward | |
| 5,656,778 A | 8/1997 | Roszhart | |
| 5,703,292 A | 12/1997 | Ward | |
| 5,723,790 A | 3/1998 | Andersson | |
| 5,751,154 A | 5/1998 | Tsugai | |
| 5,760,465 A | 6/1998 | Alcoe et al. | |
| 5,765,046 A | 6/1998 | Watanabe et al. | |
| 5,894,091 A | 4/1999 | Kubota | |
| 6,131,457 A | 10/2000 | Sato | |
| 6,214,644 B1 | 4/2001 | Glenn | |
| 6,250,157 B1 | 6/2001 | Touge | |
| 6,253,612 B1 | 7/2001 | Lemkin et al. | |
| 6,301,965 B1 | 10/2001 | Chu et al. | |
| 6,351,996 B1 | 3/2002 | Nasiri et al. | |
| 6,366,468 B1 | 4/2002 | Pan | |
| 6,390,905 B1 | 5/2002 | Korovin et al. | |
| 6,501,282 B1 | 12/2002 | Dummermuth et al. | |
| 6,504,385 B2 | 1/2003 | Hartwell | |
| 6,553,835 B1 | 4/2003 | Hobbs et al. | |
| 6,722,206 B2 | 4/2004 | Takada | |
| 6,725,719 B2 | 4/2004 | Cardarelli | |
| 6,737,742 B2 | 5/2004 | Sweterlitsch | |
| 6,781,231 B2 | 8/2004 | Minervini et al. | |
| 6,848,304 B2 | 2/2005 | Geen | |
| 7,051,590 B1 | 5/2006 | Lemkin et al. | |
| 7,054,778 B2 | 5/2006 | Geiger et al. | |
| 7,093,487 B2 | 8/2006 | Mochida | |
| 7,166,910 B2 | 1/2007 | Minervini et al. | |
| 7,202,552 B2 | 4/2007 | Zhe et al. | |
| 7,210,351 B2 | 5/2007 | Lo et al. | |
| 7,221,767 B2 | 5/2007 | Mullenborn et al. | |
| 7,240,552 B2 | 7/2007 | Acar et al. | |
| 7,258,011 B2 | 8/2007 | Nasiri et al. | |
| 7,258,012 B2 | 8/2007 | Xie | |
| 7,266,349 B2 | 9/2007 | Kappes | |
| 7,293,460 B2 | 11/2007 | Zarabadi et al. | |
| 7,301,212 B1 | 11/2007 | Mian et al. | |
| 7,305,880 B2 | 12/2007 | Caminada et al. | |
| 7,358,151 B2 | 4/2008 | Araki et al. | |
| 7,436,054 B2 | 10/2008 | Zhe | |
| 7,449,355 B2 | 11/2008 | Lutz et al. | |
| 7,451,647 B2 | 11/2008 | Matsuhisa et al. | |
| 7,454,967 B2 | 11/2008 | Skurnik | |
| 7,518,493 B2 | 4/2009 | Bryzek et al. | |
| 7,539,003 B2 | 5/2009 | Ray | |
| 7,544,531 B1 | 6/2009 | Grosjean | |
| 7,595,648 B2 | 9/2009 | Ungaretti et al. | |
| 7,600,428 B2 | 10/2009 | Robert et al. | |
| 7,616,078 B2 | 11/2009 | Prandi et al. | |
| 7,622,782 B2 | 11/2009 | Chu et al. | |
| 7,694,563 B2 | 4/2010 | Durante et al. | |
| 7,706,149 B2 | 4/2010 | Yang et al. | |
| 7,781,249 B2 | 8/2010 | Laming et al. | |
| 7,795,078 B2 | 9/2010 | Ramakrishna et al. | |
| 7,851,925 B2 | 12/2010 | Theuss et al. | |
| 7,859,352 B2 | 12/2010 | Sutton | |
| 7,950,281 B2 | 5/2011 | Hammerschmidt | |
| 8,004,354 B1 | 8/2011 | Pu et al. | |
| 8,006,557 B2 | 8/2011 | Yin et al. | |
| 8,026,771 B2 | 9/2011 | Kanai et al. | |
| 8,037,755 B2 | 10/2011 | Nagata et al. | |
| 8,113,050 B2 | 2/2012 | Acar et al. | |
| 8,171,792 B2 | 5/2012 | Sameshima | |
| 8,201,449 B2 | 6/2012 | Ohuchi et al. | |
| 8,250,921 B2 | 8/2012 | Nasiri et al. | |
| 8,256,290 B2 | 9/2012 | Mao | |
| 8,375,789 B2 | 2/2013 | Prandi et al. | |
| 8,378,756 B2 | 2/2013 | Huang et al. | |
| 8,421,168 B2 | 4/2013 | Allen et al. | |
| 8,476,970 B2 | 7/2013 | Mokhtar et al. | |
| 8,508,290 B2 | 8/2013 | Elsayed et al. | |
| 8,643,382 B2 | 2/2014 | Steele et al. | |
| 8,710,599 B2 | 4/2014 | Marx et al. | |
| 8,739,626 B2 | 6/2014 | Acar | |
| 8,742,964 B2 | 6/2014 | Kleks et al. | |
| 8,754,694 B2 | 6/2014 | Opris et al. | |
| 8,763,459 B2 | 7/2014 | Brand et al. | |
| 8,813,564 B2 | 8/2014 | Acar | |
| 8,978,475 B2 | 3/2015 | Acar | |
| 9,003,882 B1 | 4/2015 | Ayazi et al. | |
| 9,006,846 B2 | 4/2015 | Bryzek et al. | |
| 9,062,972 B2 | 6/2015 | Acar et al. | |
| 9,069,006 B2 | 6/2015 | Opris et al. | |
| 9,094,027 B2 | 7/2015 | Tao et al. | |
| 9,095,072 B2 | 7/2015 | Bryzek et al. | |
| 2002/0021059 A1 | 2/2002 | Knowles et al. | |
| 2002/0117728 A1 | 8/2002 | Brosnihan et al. | |
| 2002/0178831 A1 | 12/2002 | Takada | |
| 2002/0189352 A1 | 12/2002 | Reeds, III et al. | |
| 2002/0196445 A1 | 12/2002 | McClary et al. | |
| 2003/0038415 A1 | 2/2003 | Anderson et al. | |
| 2003/0061878 A1 | 4/2003 | Pinson | |
| 2003/0200807 A1 | 10/2003 | Hulsing, II | |
| 2003/0222337 A1 | 12/2003 | Stewart | |
| 2004/0085784 A1 | 5/2004 | Salama et al. | |
| 2004/0119137 A1 | 6/2004 | Leonardi et al. | |
| 2004/0177689 A1 | 9/2004 | Cho | |
| 2004/0211258 A1 | 10/2004 | Geen | |
| 2004/0219340 A1 | 11/2004 | McNeil et al. | |
| 2004/0231420 A1 | 11/2004 | Xie et al. | |
| 2004/0251793 A1 | 12/2004 | Matsuhisa | |
| 2005/0005698 A1 | 1/2005 | McNeil et al. | |
| 2005/0097957 A1 | 5/2005 | Mcneil et al. | |
| 2005/0139005 A1 | 6/2005 | Geen | |
| 2005/0189635 A1 | 9/2005 | Humpston et al. | |
| 2005/0274181 A1 | 12/2005 | Kutsuna et al. | |
| 2006/0032308 A1 | 2/2006 | Acar et al. | |
| 2006/0034472 A1 | 2/2006 | Bazarjani et al. | |
| 2006/0043608 A1 | 3/2006 | Bernier et al. | |
| 2006/0097331 A1 | 5/2006 | Hattori | |
| 2006/0112764 A1 | 6/2006 | Higuchi | |
| 2006/0137457 A1 | 6/2006 | Zdeblick | |
| 2006/0207328 A1 | 9/2006 | Zarabadi et al. | |
| 2006/0213265 A1 | 9/2006 | Weber et al. | |
| 2006/0213266 A1 | 9/2006 | French et al. | |
| 2006/0213268 A1 | 9/2006 | Asami et al. | |
| 2006/0246631 A1 | 11/2006 | Lutz et al. | |
| 2006/0283245 A1 | 12/2006 | Konno et al. | |
| 2007/0013052 A1 | 1/2007 | Zhe et al. | |
| 2007/0034005 A1 | 2/2007 | Acar et al. | |
| 2007/0040231 A1 | 2/2007 | Harney et al. | |
| 2007/0042606 A1 | 2/2007 | Wang et al. | |
| 2007/0047744 A1 | 3/2007 | Harney et al. | |
| 2007/0071268 A1 | 3/2007 | Harney et al. | |
| 2007/0085544 A1 | 4/2007 | Viswanathan | |
| 2007/0099327 A1 | 5/2007 | Hartzell et al. | |
| 2007/0113653 A1 | 5/2007 | Nasiri et al. | |
| 2007/0114643 A1 | 5/2007 | DCamp et al. | |
| 2007/0165888 A1 | 7/2007 | Weigold | |
| 2007/0205492 A1 | 9/2007 | Wang | |
| 2007/0220973 A1 | 9/2007 | Acar | |
| 2007/0222021 A1 | 9/2007 | Yao | |
| 2007/0284682 A1 | 12/2007 | Laming et al. | |
| 2008/0049230 A1 | 2/2008 | Chin et al. | |
| 2008/0079120 A1 | 4/2008 | Foster et al. | |
| 2008/0079444 A1 | 4/2008 | Denison | |
| 2008/0081398 A1 | 4/2008 | Lee et al. | |
| 2008/0083958 A1 | 4/2008 | Wei et al. | |
| 2008/0083960 A1 | 4/2008 | Chen et al. | |
| 2008/0092652 A1 | 4/2008 | Acar | |
| 2008/0122439 A1 | 5/2008 | Burdick et al. | |
| 2008/0157238 A1 | 7/2008 | Hsiao | |
| 2008/0157301 A1 | 7/2008 | Ramakrishna et al. | |

(56) References Cited

U.S. PATENT DOCUMENTS

| | | |
|---|---|---|
| 2008/0169811 A1 | 7/2008 | Viswanathan |
| 2008/0202237 A1 | 8/2008 | Hammerschmidt |
| 2008/0245148 A1 | 10/2008 | Fukumoto |
| 2008/0247585 A1 | 10/2008 | Leidl et al. |
| 2008/0251866 A1 | 10/2008 | Belt et al. |
| 2008/0290756 A1 | 11/2008 | Huang |
| 2008/0302559 A1 | 12/2008 | Leedy |
| 2008/0314147 A1 | 12/2008 | Nasiri et al. |
| 2009/0007661 A1 | 1/2009 | Nasiri et al. |
| 2009/0064780 A1 | 3/2009 | Coronato et al. |
| 2009/0064781 A1 | 3/2009 | Ayazi et al. |
| 2009/0072663 A1 | 3/2009 | Ayazi et al. |
| 2009/0114016 A1 | 5/2009 | Nasiri et al. |
| 2009/0140606 A1 | 6/2009 | Huang |
| 2009/0166827 A1 | 7/2009 | Foster et al. |
| 2009/0175477 A1 | 7/2009 | Suzuki et al. |
| 2009/0183570 A1 | 7/2009 | Acar et al. |
| 2009/0194829 A1 | 8/2009 | Chung et al. |
| 2009/0217757 A1 | 9/2009 | Nozawa |
| 2009/0263937 A1 | 10/2009 | Ramakrishna et al. |
| 2009/0266163 A1 | 10/2009 | Ohuchi et al. |
| 2009/0272189 A1 | 11/2009 | Acar et al. |
| 2010/0019393 A1 | 1/2010 | Hsieh et al. |
| 2010/0024548 A1 | 2/2010 | Cardarelli |
| 2010/0038733 A1 | 2/2010 | Minervini |
| 2010/0044853 A1 | 2/2010 | Dekker et al. |
| 2010/0052082 A1 | 3/2010 | Lee et al. |
| 2010/0058864 A1 | 3/2010 | Hsu et al. |
| 2010/0072626 A1 | 3/2010 | Theuss et al. |
| 2010/0089154 A1 | 4/2010 | Ballas et al. |
| 2010/0122579 A1 | 5/2010 | Hsu et al. |
| 2010/0126269 A1 | 5/2010 | Coronato et al. |
| 2010/0155863 A1 | 6/2010 | Weekamp |
| 2010/0206074 A1 | 8/2010 | Yoshida et al. |
| 2010/0212425 A1 | 8/2010 | Hsu et al. |
| 2010/0224004 A1 | 9/2010 | Suminto et al. |
| 2010/0236327 A1 | 9/2010 | Mao et al. |
| 2010/0294039 A1 | 11/2010 | Geen |
| 2011/0023605 A1 | 2/2011 | Tripoli et al. |
| 2011/0030473 A1 | 2/2011 | Acar |
| 2011/0030474 A1 | 2/2011 | Kuang et al. |
| 2011/0031565 A1 | 2/2011 | Marx et al. |
| 2011/0094302 A1 | 4/2011 | Schofield et al. |
| 2011/0120221 A1 | 5/2011 | Yoda |
| 2011/0121413 A1 | 5/2011 | Allen et al. |
| 2011/0146403 A1 | 6/2011 | Rizzo Piazza Roncoroni et al. |
| 2011/0147859 A1 | 6/2011 | Tanaka et al. |
| 2011/0179868 A1 | 7/2011 | Kaino et al. |
| 2011/0201197 A1 | 8/2011 | Nilsson et al. |
| 2011/0265564 A1 | 11/2011 | Acar et al. |
| 2011/0285445 A1 | 11/2011 | Huang et al. |
| 2011/0316048 A1 | 12/2011 | Ikeda et al. |
| 2012/0126349 A1 | 5/2012 | Horning et al. |
| 2012/0326248 A1 | 12/2012 | Daneman et al. |
| 2013/0098153 A1 | 4/2013 | Trusov et al. |
| 2013/0139591 A1 | 6/2013 | Acar |
| 2013/0192364 A1 | 8/2013 | Acar |
| 2013/0192369 A1* | 8/2013 | Acar et al. ............... 73/514.01 |
| 2013/0199263 A1 | 8/2013 | Egretzberger et al. |
| 2013/0221457 A1 | 8/2013 | Conti et al. |
| 2013/0247666 A1 | 9/2013 | Acar |
| 2013/0247668 A1 | 9/2013 | Bryzek |
| 2013/0250532 A1 | 9/2013 | Bryzek et al. |
| 2013/0257487 A1 | 10/2013 | Opris et al. |
| 2013/0263641 A1 | 10/2013 | Opris et al. |
| 2013/0263665 A1 | 10/2013 | Opris et al. |
| 2013/0265070 A1 | 10/2013 | Kleks et al. |
| 2013/0265183 A1 | 10/2013 | Kleks et al. |
| 2013/0268227 A1 | 10/2013 | Opris et al. |
| 2013/0268228 A1 | 10/2013 | Opris et al. |
| 2013/0269413 A1 | 10/2013 | Tao et al. |
| 2013/0270657 A1 | 10/2013 | Acar et al. |
| 2013/0270660 A1 | 10/2013 | Bryzek et al. |
| 2013/0271228 A1 | 10/2013 | Tao et al. |
| 2013/0277772 A1 | 10/2013 | Bryzek et al. |
| 2013/0277773 A1 | 10/2013 | Bryzek et al. |
| 2013/0283911 A1 | 10/2013 | Ayazi et al. |
| 2013/0298671 A1 | 11/2013 | Acar et al. |
| 2013/0328139 A1 | 12/2013 | Acar |
| 2013/0341737 A1 | 12/2013 | Bryzek et al. |
| 2014/0070339 A1 | 3/2014 | Marx |
| 2014/0275857 A1 | 9/2014 | Toth et al. |
| 2015/0059473 A1 | 3/2015 | Jia |
| 2015/0114112 A1 | 4/2015 | Valzasina et al. |
| 2015/0185012 A1 | 7/2015 | Acar |

FOREIGN PATENT DOCUMENTS

| | | |
|---|---|---|
| CN | 1206110 A | 1/1999 |
| CN | 1221210 A | 6/1999 |
| CN | 1272622 A | 11/2000 |
| CN | 1389704 A | 1/2003 |
| CN | 1532524 A | 9/2004 |
| CN | 1595062 A | 3/2005 |
| CN | 1595063 A | 3/2005 |
| CN | 1603842 A | 4/2005 |
| CN | 1617334 A | 5/2005 |
| CN | 1659810 A | 8/2005 |
| CN | 1693181 A | 11/2005 |
| CN | 1813192 A | 8/2006 |
| CN | 1816747 A | 8/2006 |
| CN | 1818552 A | 8/2006 |
| CN | 1886669 A | 12/2006 |
| CN | 1905167 A | 1/2007 |
| CN | 1948906 A | 4/2007 |
| CN | 101038299 A | 9/2007 |
| CN | 101059530 A | 10/2007 |
| CN | 101067555 A | 11/2007 |
| CN | 101069099 A | 11/2007 |
| CN | 101171665 A | 4/2008 |
| CN | 101180516 A | 5/2008 |
| CN | 101217263 A | 7/2008 |
| CN | 101239697 A | 8/2008 |
| CN | 101257000 A | 9/2008 |
| CN | 101270988 A | 9/2008 |
| CN | 101316462 A | 12/2008 |
| CN | 101329446 A | 12/2008 |
| CN | 101426718 A | 5/2009 |
| CN | 101459866 A | 6/2009 |
| CN | 101519183 A | 9/2009 |
| CN | 101520327 A | 9/2009 |
| CN | 101561275 A | 10/2009 |
| CN | 101634662 A | 1/2010 |
| CN | 101638211 A | 2/2010 |
| CN | 101813480 A | 8/2010 |
| CN | 101839718 A | 9/2010 |
| CN | 101055180 A | 10/2010 |
| CN | 101858928 A | 10/2010 |
| CN | 101916754 A | 12/2010 |
| CN | 101922934 A | 12/2010 |
| CN | 201688848 U | 12/2010 |
| CN | 102109345 A | 6/2011 |
| CN | 102337541 A | 2/2012 |
| CN | 102364671 A | 2/2012 |
| CN | 102597699 A | 7/2012 |
| CN | 103209922 A | 7/2013 |
| CN | 103210278 A | 7/2013 |
| CN | 103221331 A | 7/2013 |
| CN | 103221332 A | 7/2013 |
| CN | 103221333 A | 7/2013 |
| CN | 103221778 A | 7/2013 |
| CN | 103221779 A | 7/2013 |
| CN | 103221795 A | 7/2013 |
| CN | 103238075 A | 8/2013 |
| CN | 103363969 A | 10/2013 |
| CN | 103363983 A | 10/2013 |
| CN | 103364590 A | 10/2013 |
| CN | 103364593 A | 10/2013 |
| CN | 103368503 A | 10/2013 |
| CN | 103368562 A | 10/2013 |
| CN | 103368577 A | 10/2013 |
| CN | 103376099 A | 10/2013 |
| CN | 103376102 A | 10/2013 |
| CN | 103403495 A | 11/2013 |

(56) References Cited

FOREIGN PATENT DOCUMENTS

| | | |
|---|---|---|
| CN | 203275441 U | 11/2013 |
| CN | 203275442 U | 11/2013 |
| CN | 203301454 U | 11/2013 |
| CN | 203349832 U | 12/2013 |
| CN | 203349834 U | 12/2013 |
| CN | 103663344 A | 3/2014 |
| CN | 203683082 U | 7/2014 |
| CN | 203719664 U | 7/2014 |
| CN | 104094084 A | 10/2014 |
| CN | 104105945 A | 10/2014 |
| CN | 104220840 A | 12/2014 |
| CN | 104272062 A | 1/2015 |
| DE | 112011103124 T5 | 12/2013 |
| DE | 102013014881 A1 | 3/2014 |
| EP | 1055910 A1 | 11/2000 |
| EP | 1460380 A1 | 9/2004 |
| EP | 1521086 A1 | 4/2005 |
| EP | 1688705 A2 | 8/2006 |
| EP | 1832841 A1 | 9/2007 |
| EP | 1860402 A1 | 11/2007 |
| EP | 2053413 A1 | 4/2009 |
| EP | 2259019 A1 | 12/2010 |
| EP | 2466257 A1 | 6/2012 |
| JP | 0089927 A | 4/1997 |
| JP | 09089927 A | 4/1997 |
| JP | 10239347 A | 9/1998 |
| JP | 1164002 A | 3/1999 |
| JP | 2000046560 A | 2/2000 |
| JP | 2005024310 A | 1/2005 |
| JP | 2005114394 A | 4/2005 |
| JP | 2005294462 A | 10/2005 |
| JP | 3882972 B2 | 2/2007 |
| JP | 2007024864 A | 2/2007 |
| JP | 2008294455 A | 12/2008 |
| JP | 2009075097 A | 4/2009 |
| JP | 2009186213 A | 8/2009 |
| JP | 2010025898 A | 2/2010 |
| JP | 2010506182 A | 2/2010 |
| KR | 1020110055449 A1 | 5/2011 |
| KR | 1020130052652 A | 5/2013 |
| KR | 1020130052653 A | 5/2013 |
| KR | 1020130054441 A | 5/2013 |
| KR | 1020130055693 A | 5/2013 |
| KR | 1020130057485 A | 5/2013 |
| KR | 1020130060338 A | 6/2013 |
| KR | 1020130061181 A | 6/2013 |
| KR | 101311966 B1 | 9/2013 |
| KR | 1020130097209 A | 9/2013 |
| KR | 101318810 B1 | 10/2013 |
| KR | 1020130037462 A | 10/2013 |
| KR | 1020130112789 A | 10/2013 |
| KR | 1020130112792 A | 10/2013 |
| KR | 1020130112804 A | 10/2013 |
| KR | 1020130113386 A | 10/2013 |
| KR | 1020130113391 A | 10/2013 |
| KR | 1020130116189 A | 10/2013 |
| KR | 1020130116212 A | 10/2013 |
| KR | 101332701 B1 | 11/2013 |
| KR | 1020130139914 A | 12/2013 |
| KR | 1020130142116 A | 12/2013 |
| KR | 101352827 B1 | 1/2014 |
| KR | 1020140034713 A | 3/2014 |
| TW | I255341 B | 5/2006 |
| WO | WO-0107875 A1 | 2/2001 |
| WO | WO-0175455 A2 | 10/2001 |
| WO | WO-2008059757 A1 | 5/2008 |
| WO | WO-2008087578 A2 | 7/2008 |
| WO | WO-2009050578 A2 | 4/2009 |
| WO | WO-2009156485 A1 | 12/2009 |
| WO | WO-2011016859 A2 | 2/2011 |
| WO | WO-2011016859 A3 | 2/2011 |
| WO | WO-2011107542 A2 | 9/2011 |
| WO | WO-2012037492 A2 | 3/2012 |
| WO | WO-2012037492 A3 | 3/2012 |
| WO | WO-2012037501 A2 | 3/2012 |
| WO | WO-2012037501 A3 | 3/2012 |
| WO | WO-2012037536 A2 | 3/2012 |
| WO | WO-2012037537 A2 | 3/2012 |
| WO | WO-2012037538 A2 | 3/2012 |
| WO | WO-2012037539 A1 | 3/2012 |
| WO | WO-2012037539 A9 | 3/2012 |
| WO | WO-2012037540 A2 | 3/2012 |
| WO | WO-2012040194 A1 | 3/2012 |
| WO | WO-2012040211 A2 | 3/2012 |
| WO | WO-2012040245 A2 | 3/2012 |
| WO | WO-2012040245 A3 | 3/2012 |
| WO | WO-2013115967 A1 | 8/2013 |
| WO | WO-2013116356 A1 | 8/2013 |
| WO | WO-2013116514 A1 | 8/2013 |
| WO | WO-2013116522 A1 | 8/2013 |

OTHER PUBLICATIONS

"U.S. Appl. No. 12/849,742, Supplemental Notice of Allowability mailed Mar. 17, 2014", 3 pgs.

"U.S. Appl. No. 12/849,742, Supplemental Notice of Allowability mailed May 5, 2014", 2 pgs.

"U.S. Appl. No. 12/849,787, Notice of Allowance mailed Dec. 11, 2013", 9 pgs.

"U.S. Appl. No. 12/849,787, Supplemental Notice of Allowability mailed Mar. 21, 2014", 3 pgs.

"U.S. Appl. No. 13/362,955, Non Final Office Action mailed Apr. 15, 2014", 9 pgs.

"U.S. Appl. No. 13/362,955, Response filed Feb. 17, 2014 to Restriction Requirement mailed Dec. 17, 2013", 9 pgs.

"U.S. Appl. No. 13/362,955, Restriction Requirement mailed Dec. 17, 2013", 6 pgs.

"U.S. Appl. No. 13/363,537, Non Final Office Action mailed Feb. 6, 2014", 10 pgs.

"U.S. Appl. No. 13/363,537, Response filed Jun. 6, 2014 to Non Final Office Action mailed Feb. 6, 2014", 11 pgs.

"U.S. Appl. No. 13/742,942, Notice of Allowance mailed Jan. 28, 2014", 9 pgs.

"U.S. Appl. No. 13/742,942, Supplemental Notice of Allowability mailed Apr. 10, 2014", 2 pgs.

"U.S. Appl. No. 13/746,016, Notice of Allowance mailed Jan. 17, 2014", 10 pgs.

"U.S. Appl. No. 13/755,841, Notice of Allowance mailed May 7, 2014", 8 pgs.

"U.S. Appl. No. 13/755,841, Preliminary Amendment filed Oct. 10, 2013", 10 pgs.

"U.S. Appl. No. 13/755,841, Response filed Apr. 21, 2014 to Restriction Requirement mailed Feb. 21, 2014", 7 pgs.

"U.S. Appl. No. 13/755,841, Restriction Requirement mailed Feb. 21, 2014", 6 pgs.

"U.S. Appl. No. 13/821,589, Restriction Requirement mailed Apr. 11, 2014", 10 pgs.

"Chinese Application Serial No. 2010800423190, Office Action mailed Mar. 26, 2014", 10 pgs.

"Chinese Application Serial No. 201180053926.1, Office Action mailed Jan. 13, 2014", 7 pgs.

"Chinese Application Serial No. 201180053926.1, Response filed Apr. 29, 2014 to Office Action mailed Jan. 13, 2014", w/English Claims, 10 pgs.

"Chinese Application Serial No. 201180054796.3, Office Action mailed Jan. 16, 2014", 8 pgs.

"Chinese Application Serial No. 201180055029.4, Office Action mailed Jan. 13, 2014", 7 pgs.

"Chinese Application Serial No. 201180055029.4, Response filed May 27, 2014 to Office Action mailed Jan. 13, 2014", w/English Claims, 29 pgs.

"Chinese Application Serial No. 201180055309.5, Office Action mailed Mar. 31, 2014", w/English Claims, 7 pgs.

"Chinese Application Serial No. 201320172366.8, Office Action mailed Jan. 30, 2014", w/English Claims, 3 pgs.

"Chinese Application Serial No. 201320172366.8, Office Action mailed Oct. 25, 2013", 8 pgs.

(56) References Cited

OTHER PUBLICATIONS

"Chinese Application Serial No. 201320172366.8, Response filed Mar. 18, 2014 to Office Action mailed Jan. 30, 2014", w/English Claims, 20 pgs.

"Chinese Application Serial No. 201320172366.8, Response filed Dec. 24, 2013 to Office Action mailed Oct. 25, 2013", 11 pgs.

"Chinese Application Serial No. 201320565239.4, Office Action mailed Jan. 16, 2014", w/English Translation, 3 pgs.

"Chinese Application Serial No. 201320565239.4, Response filed Mar. 31, 2014 to Office Action mailed Jan. 16, 2014", w/English Claims, 38 pgs.

"European Application Serial No. 10806751.3, Extended European Search Report mailed Jan. 7, 2014", 7 pgs.

"European Application Serial No. 118260070.2, Office Action mailed Mar. 12, 2014", 1 pg.

"European Application Serial No. 11826070.2, Extended European Search Report mailed Feb. 21, 2014", 5 pgs.

"European Application Serial No. 11826071.0, Extended European Search Report mailed Feb. 20, 2014", 6 pgs.

"European Application Serial No. 11826071.0, Office Action mailed Mar. 12, 2014", 1 pg.

"European Application Serial No. 13001692.6, Response filed Apr. 1, 2014 to Extended European Search Report mailed Jul. 24, 2013", 19 pgs.

"European Application Serial No. 13001721.3, Response filed Apr. 7, 2014 to Extended European Search Report mailed Jul. 18, 2013", 25 pgs.

"Korean Application Serial No. 10-2013-0109990, Amendment filed Dec. 10, 2013", 4 pgs.

"Korean Application Serial No. 10-2013-7009775, Office Action mailed Dec. 27, 2013", 8 pgs.

"Korean Application Serial No. 10-2013-7009775, Response filed Oct. 29, 2013 to Office Action mailed Sep. 17, 2013", w/English Claims, 23 pgs.

"Korean Application Serial No. 10-2013-7009777, Office Action mailed Jan. 27, 2014", 5 pgs.

"Korean Application Serial No. 10-2013-7009777, Response filed Apr. 28, 2014", w/English Claims, 19 pgs.

"Korean Application Serial No. 10-2013-7009777, Response filed Nov. 5, 2013 to Office Action mailed Sep. 17, 2013", 11 pgs.

"Korean Application Serial No. 10-2013-7009788, Office Action mailed Dec. 27, 2013", w/English Translation, 10 pgs.

"Korean Application Serial No. 10-2013-7009788, Response filed Oct. 29, 2013 to Office Action mailed Aug. 29, 2013", w/English Claims, 22 pgs.

"U.S. Appl. No. 12/849,742, Non Final Office Action mailed Mar. 28, 2013", 9 pgs.

"U.S. Appl. No. 12/849,742, Non Final Office Action mailed Aug. 23, 2012", 9 pgs.

"U.S. Appl. No. 12/849,742, Response filed Jan. 23, 2012 to Non Final Office Action mailed Aug. 23, 2012", 10 pgs.

"U.S. Appl. No. 12/849,787, Non Final Office Action mailed May 28, 2013", 18 pgs.

"U.S. Appl. No. 12/849,787, Response filed Feb. 4, 2013 to Restriction Requirement mailed Oct. 4, 2012", 7 pgs.

"U.S. Appl. No. 12/849,787, Restriction Requirement mailed Oct. 4, 2012", 5 pgs.

"U.S. Appl. No. 12/947,543, Notice of Allowance mailed Dec. 17, 2012", 11 pgs.

"U.S. Appl. No. 13/813,443, Preliminary Amendment mailed Jan. 31, 2013", 3 pgs.

"U.S. Appl. No. 13/821,586, Preliminary Amendment mailed Mar. 8, 2013", 6 pgs.

"U.S. Appl. No. 13/821,589, Preliminary Amendment mailed Mar. 8, 2013", 6 pgs.

"U.S. Appl. No. 13/821,598, Preliminary Amendment mailed Mar. 8, 13", 7 pgs.

"U.S. Appl. No. 13/821,609, Preliminary Amendment mailed Mar. 8, 2013", 3 pgs.

"U.S. Appl. No. 13/821,612, Preliminary Amendment mailed Mar. 8, 2013", 3 pgs.

"U.S. Appl. No. 13/821,619, Preliminary Amendment mailed Mar. 8, 2013", 3 pgs.

"U.S. Appl. No. 13/821,793, Preliminary Amendment mailed Mar. 8, 2013", 3 pgs.

"U.S. Appl. No. 13/821,842, Preliminary Amendment mailed Mar. 8, 2013", 3 pgs.

"U.S. Appl. No. 13/821,853, Preliminary Amendment mailed Mar. 8, 2013", 3 pgs.

"Application Serial No. PCT/US2011/051994, International Republished Application mailed Jun. 7, 2012", 1 pg.

"Application Serial No. PCT/US2011/052006, International Republished Application mailed Jun. 7, 2012", 1 pg.

"Application Serial No. PCT/US2011/052417, International Republished Application mailed Jun. 7, 2012", 1 pg.

"DigiSiMic™ Digital Silicon Microphone Pulse Part No. TC100E", TC100E Datasheet version 4.2 DigiSiMic™ Digital Silicon Microphone. (Jan. 2009), 6 pgs.

"EPCOS MEMS Microphone With TSV", 1 pg.

"International Application Serial No. PCT/US2010/002166, International Preliminary Report on Patentability mailed Feb. 16, 2012", 6 pgs.

"International Application Serial No. PCT/US2010/002166, International Search Report mailed Feb. 28, 2011", 3 pgs.

"International Application Serial No. PCT/US2010/002166, Written Opinion mailed Feb. 28, 2011", 4 pgs.

"International Application Serial No. PCT/US2011/051994, International Preliminary Report on Patentability mailed Mar. 28, 2013", 8 pgs.

"International Application Serial No. PCT/US2011/051994, International Search Report mailed Apr. 16, 2012", 3 pgs.

"International Application Serial No. PCT/US2011/051994, Written Opinion mailed Apr. 16, 2012", 6 pgs.

"International Application Serial No. PCT/US2011/052006, International Preliminary Report on Patentability mailed Mar. 28, 2013", 7 pgs.

"International Application Serial No. PCT/US2011/052006, Search Report mailed Apr. 16, 2012", 3 pgs.

"International Application Serial No. PCT/US2011/052006, Written Opinion mailed Apr. 16, 2012", 5 pgs.

"International Application Serial No. PCT/US2011/052059, International Preliminary Report on Patentability mailed Jan. 22, 2013", 14 pgs.

"International Application Serial No. PCT/US2011/052059, Search Report mailed Apr. 20, 2012", 4 pgs.

"International Application Serial No. PCT/US2011/052059, Written Opinion mailed Apr. 20, 2012", 7 pgs.

"International Application Serial No. PCT/US2011/052060, International Preliminary Report on Patentability mailed Jan. 22, 2013", 12 pgs.

"International Application Serial No. PCT/US2011/052060, International Search Report Apr. 20, 2012", 3 pgs.

"International Application Serial No. PCT/US2011/052060, Written Opinion mailed Apr. 20, 2012", 7 pgs.

"International Application Serial No. PCT/US2011/052061, International Preliminary Report on Patentability mailed Mar. 28, 2013", 6 pgs.

"International Application Serial No. PCT/US2011/052061, International Search Report mailed Apr. 10, 2012", 3 pgs.

"International Application Serial No. PCT/US2011/052061, Written Opinion mailed Apr. 10, 2012", 4 pgs.

"International Application Serial No. PCT/US2011/052064, International Preliminary Report on Patentability mailed Mar. 28, 2013", 5 pgs.

"International Application Serial No. PCT/US2011/052064, Search Report mailed Feb. 29, 2012", 3 pgs.

"International Application Serial No. PCT/US2011/052064, Written Opinion mailed Feb. 29, 2012", 3 pgs.

"International Application Serial No. PCT/US2011/052065, International Preliminary Report on Patentability mailed Mar. 28, 2013", 7 pgs.

(56) References Cited

OTHER PUBLICATIONS

"International Application Serial No. PCT/US2011/052065, International Search Report mailed Apr. 10, 2012", 3 pgs.
"International Application Serial No. PCT/US2011/052065, Written Opinion mailed Apr. 10, 2012", 5 pgs.
"International Application Serial No. PCT/US2011/052340, International Preliminary Report on Patentability mailed Apr. 4, 2013", 5 pgs.
"International Application Serial No. PCT/US2011/052340, Search Report mailed Feb. 29, 2012", 3 pgs.
"International Application Serial No. PCT/US2011/052340, Written Opinion mailed Feb. 29, 2012", 3 pgs.
"International Application Serial No. PCT/US2011/052369, International Preliminary Report on Patentability mailed Apr. 4, 2013", 5 pgs.
"International Application Serial No. PCT/US2011/052369, International Search Report mailed Apr. 24, 2012", 6 pgs.
"International Application Serial No. PCT/US2011/052369, Written Opinion mailed Apr. 24, 2012", 3 pgs.
"International Application Serial No. PCT/US2011/052417, International Preliminary Report on Patentability mailed Apr. 4, 2013", 6 pgs.
"International Application Serial No. PCT/US2011/052417, International Search Report mailed Apr. 23, 2012", 5 pgs.
"International Application Serial No. PCT/US2011/052417, Written Opinion mailed Apr. 23, 2012", 4 pgs.
"International Application Serial No. PCT/US2013/021411, International Search Report mailed Apr. 30, 2013", 5 pgs.
"International Application Serial No. PCT/US2013/021411, Written Opinion mailed Apr. 30, 2013", 5 pgs.
"International Application Serial No. PCT/US2013/023877, International Search Report mailed May 14, 2013", 3 pgs.
"International Application Serial No. PCT/US2013/023877, Written Opinion mailed May 14, 2013", 5 pgs.
"International Application Serial No. PCT/US2013/024149, Written Opinion mailed", 4 pages.
"International Application Serial No. PCT/US2013/024149, International Search Report mailed", 7 pages.
"T4020 & T4030 MEMS Microphones for Consumer Electronics", Product Brief 2010, Edition Feb. 2010, (2010), 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, (209), 187-206.
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEMS Vibratory Gyroscopes: Structural Approaches to Improve Robustness, Springer, (2009), 225-245.
Beyne, E, et al., "Through-silicon via and die stacking technologies for microsystems-integration", IEEE International Electron Devices Meeting, 2008. IEDM 2008., (Dec. 2008), 1-4.
Cabruja, Enric, et al., "Piezoresistive Accelerometers for MCM-Package-Part II", The Packaging Journal of Microelectromechanical Systems. vol. 14, No. 4, (Aug. 2005), 806-811.
Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176, http://www.eecs.berkeley.edu/Pubs/TechRpts/2007/EECS-2007-176.html, (Dec. 21, 2007), 94 pgs.
Krishnamurthy, Rajesh, et al., "Drilling and Filling, but not in your Dentist's Chair A look at some recent history of multi-chip and through silicon via (TSV) technology", Chip Design Magazine, (Oct./Nov. 2008), 7 pgs.
Rimskog, Magnus, "Through Wafer Via Technology for MEMS and 3D Integration", 32nd IEEE/CPMT International Electronic Manufacturing Technology Symposium, 2007. IEMT '07., (2007), 286-289.
"U.S. Appl. No. 13/363,537, Final Office Action mailed Jun. 27, 2014", 8 pgs.
"U.S. Appl. No. 13/742,942, Notice of Allowance mailed Jan. 28, 2014", 8 pgs.
"U.S. Appl. No. 13/755,841, Supplemental Notice of Allowability Jun. 27, 2014", 2 pgs.
"U.S. Appl. No. 13/821,589, Non Final Office Action mailed Jul. 9, 2014", 10 pgs.
"U.S. Appl. No. 13/821,589, Response to Restriction Requirement mailed Apr. 11, 2014", 6 pgs.
"U.S. Appl. No. 13/821,598, Restriction Requirement mailed Aug. 15, 2014", 11 pgs.
"U.S. Appl. No. 13/821,612, Non Final Office Action mailed Jul. 23, 2014", 8 pgs.
"U.S. Appl. No. 13/821,853, Non Final Office Action mailed Jul. 30, 2014", 10 pgs.
"U.S. Appl. No. 13/860,761, Non Final Office Action mailed Aug. 19, 2014", 13 pgs.
"Chinese Application Serial No. 2010800423190, Response filed Aug. 11, 2014 to Office Action mailed Mar. 26, 2014", w/English Claims, 11 pgs.
"Chinese Application Serial No. 201180054796.3, Response filed Jun. 30, 2014 to Office Action mailed Jan. 16, 2014", w/English Claims, 3 pgs.
"Chinese Application Serial No. 201180055029.4, Office Action mailed Jul. 2, 2014", w/English Translation, 5 pgs.
"Chinese Application Serial No. 201180055309.5, Response filed Aug. 13, 2014 to Office Action mailed Mar. 31, 2014", w/English Claims, 27 pgs.
"Chinese Application Serial No. 201380007588.7, Notification to Make Rectification mailed Aug. 18, 2014", 2 pgs.
"Chinese Application Serial No. 201380007615.0, Notification to Make Rectification mailed Aug. 18, 2014", 2 pgs.
"European Application Serial No. 10806751.3, Response filed Jul. 24, 2014 to Office Action mailed Jan. 24, 2014", 26 pgs.
"European Application Serial No. 11826068.6, Extended European Search Report mailed Jul. 16, 2014", 10 pgs.
"European Application Serial No. 13001719.7, Extended European Search Report mailed Jun. 24, 2014", 10 pgs.
"International Application Serial No. PCT/US2013/021411, International Preliminary Report on Patentability mailed Aug. 14, 2014", 7 pgs.
"International Application Serial PCT/US2013/023877, International Preliminary Report on Patentability mailed Aug. 14, 2014", 7 pgs.
"International Application Serial No. PCT/US2013/024138, International Preliminary Report on Patentability mailed Aug. 14, 2014", 6 pgs.
"International Application Serial No. PCT/US2013/024149, International Preliminary Report on Patentability mailed Aug. 14, 2014", 6 pgs.
Xia, Guo-Ming, et al., "Phase correction in digital self-oscillation drive circuit for improve silicon MEMS gyroscope bias stability", Solid-State and Integrated Circuit Technology (ICSICT), 2010 10th IEEE International Conference on, IEEE, (Nov. 1, 2010), 1416-1418.
"U.S. Appl. No. 13/742,994, Non Final Office Action mailed May 1, 2015", 20 pgs.
"U.S. Appl. No. 13/813,443, Restriction Requirement mailed Apr. 29, 2015", 6 pgs.
"U.S. Appl. No. 13/821,589, Final Office Action mailed Mar. 12, 2015", 13 pgs.
"U.S. Appl. No. 13/821,609, Notice of Allowance mailed Mar. 23, 2015", 11 pgs.
"U.S. Appl. No. 13/821,842, Non Final Office Action mailed Mar. 18, 2015", 20 pgs.

(56) References Cited

OTHER PUBLICATIONS

"U.S. Appl. No. 13/860,761, Advisory Action mailed Mar. 25, 2015", 3 pgs.
"U.S. Appl. No. 13/860,761, Notice of Allowance mailed Apr. 28, 2015", 8 pgs.
"U.S. Appl. No. 13/860,761, Response filed Mar. 16, 2015 to Final Office Action mailed Jan. 16, 2015", 12 pgs.
"U.S. Appl. No. 13/860,761, Response filed Apr. 16, 2015 to Advisory Action mailed Mar. 25, 2015", 11 pgs.
"U.S. Appl. No. 14/658,579, Prliminary Amendment filed Mar. 18, 2015", 8 pgs.
"Chinese Application Serial No. 201180055823.9, Office Action mailed Mar. 19, 2015", 8 pgs.
"Chinese Application Serial No. 201180055845.5, Office Action mailed Mar. 4, 2015", 8 pgs.
"U.S. Appl. No. 12/849,742, Response filed Sep. 30, 2013 to Non-Final Office Action mailed Mar. 28, 2013", 12 pgs.
"U.S. Appl. No. 12/849,787, Response filed Oct. 28, 2013 to Non Final Office Action mailed May 28, 2013", 12 pgs.
"Chinese Application Serial No. 201180053926.1, Amendment filed Aug. 21, 2013", w/English Translation, 13 pgs.
"Chinese Application Serial No. 201180055309.5, Voluntary Amendment filed Aug. 23, 2013", w/English Translation, 13 pgs.
"Chinese Application Serial No. 201320165465.3, Office Action mailed Jul. 22, 2013", w/English Translation, 2 pgs.
"Chinese Application Serial No. 201320165465.3, Response filed Aug. 7, 2013 to Office Action mailed Jul. 22, 2013", w/English Translation, 39 pgs.
"Chinese Application Serial No. 201320171504.0, Office Action mailed Jul. 22, 2013", w/English Translation, 3 pgs.
"Chinese Application Serial No. 201320171504.0, Response filed Jul. 25, 2013 to Office Action mailed Jul. 22, 2013", w/English Translation, 33 pgs.
"Chinese Application Serial No. 201320171616.6, Office Action mailed Jul. 10, 2013", w/English Translation, 2 pgs.
"Chinese Application Serial No. 201320171757.8, Office Action mailed Jul. 11, 2013", w/English Translation, 2 pgs.
"Chinese Application Serial No. 201320171757.8, Response filed Jul. 25, 2013 to Office Action mailed Jul. 11, 2013", w/English Translation, 21 pgs.
"Chinese Application Serial No. 201320171757.8, Response filed Jul. 26, 2013 to Office Action mailed Jul. 10, 2013", w/English Translation, 40 pgs.
"Chinese Application Serial No. 201320172128.7, Office Action mailed Jul. 12, 2013", w/English Translation, 3 pgs.
"Chinese Application Serial No. 201320172128.7, Response filed Aug. 7, 2013 to Office Action mailed Jul. 12, 2013", w/English Translation, 39 pgs.
"Chinese Application Serial No. 201320172366.8, Office Action mailed Jul. 9, 2013", w/English Translation, 3 pgs.
"Chinese Application Serial No. 201320172366.8, Response filed Sep. 16, 2013 to Office Action mailed Jul. 9, 2013", w/English Translation, 24 pgs.
"Chinese Application Serial No. 201320172367.2, Office Action mailed Jul. 9, 2013", w/English Translation, 2 pgs.
"Chinese Application Serial No. 201320172367.2, Response filed Sep. 16, 2013 to Office Action mailed Jul. 9, 2013", w/English Translation, 24 pgs.
"Chinese Application Serial No. 201320185461.1, Office Action mailed Jul. 23, 2013", w/English Translation, 3 pgs.
"Chinese Application Serial No. 201320185461.1, Response filed Sep. 10, 2013 to Office Action mailed Jul. 23, 2013", w/English Translation, 25 pgs.
"Chinese Application Serial No. 201320186292.3, Office Action mailed Jul. 19, 2013", w/English Translation, 2 pgs.
"Chinese Application Serial No. 201320186292.3, Response filed Sep. 10, 2013 to Office Action mailed Jul. 19, 2013", w/English Translation, 23 pgs.
"European Application Serial No. 13001692.6, European Search Report mailed Jul. 24, 2013", 5 pgs.
"European Application Serial No. 13001696.7, Extended European Search Report mailed Aug. 6, 2013", 4 pgs.
"European Application Serial No. 13001721.3, European Search Report mailed Jul. 18, 2013", 9 pgs.
"International Application Serial No. PCT/US2013/024138, International Search Report mailed May 24, 2013", 3 pgs.
"International Application Serial No. PCT/US2013/024138, Written Opinion mailed May 24, 2013", 4 pgs.
"Korean Application Serial No. 10-2013-7009775, Office Action mailed Sep. 17, 2013", w/English Translation, 6 pgs.
"Korean Application Serial No. 10-2013-7009777, Office Action mailed Sep. 17, 2013", w/English Translation, 8 pgs.
"Korean Application Serial No. 10-2013-7009788, Office Action mailed Aug. 29, 2013", w/English Translation, 6 pgs.
"Korean Application Serial No. 10-2013-7009790, Office Action mailed Jun. 26, 2013", W/English Translation, 7 pgs.
"Korean Application Serial No. 10-2013-7009790, Response filed Aug. 26, 2013 to Office Action mailed Jun. 26, 2013", w/English Claims, 11 pgs.
"Korean Application Serial No. 10-2013-7010143, Office Action mailed May 28, 2013", w/English Translation, 5 pgs.
"Korean Application Serial No. 10-2013-7010143, Response filed Jul. 24, 2013 to Office Action mailed May 28, 2013", w/English Claims, 14 pgs.
Ferreira, Antoine, et al., "A Survey of Modeling and Control Techniques for Micro- and Nanoelectromechanical Systems", IEEE Transactions on Systems, Man and Cybernetics—Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. Cas-23, No. 1, (1976), 45-55.
Reljin, Branimir D, "Properties of SAB filters with the two-pole single-zero compensated operational amplifier", Circuit Theory and Applications: Letters to the Editor. vol. 10, (1982), 277-297.
Sedra, Adel, et al., "Chapter 8.9: Effect of Feedback on the Amplifier Poles", Microelectronic Circuits, 5th edition, (2004), 836-864.
Song-Hee, Cindy Paik, "A MEMS-Based Precision Operational Amplifier", Submitted to the Department of Electrical Engineering and Computer Sciences MIT, [Online]. Retrieved from the Internet: <URL: http://dspace.mit.edu/bitstream/handle/1721.1/16682/57138272.pdf?...>, (Jan. 1, 2004), 123 pgs.
"U.S. Appl. No. 13/362,955, Notice of Allowance mailed Feb. 25, 2015", 8 pgs.
"U.S. Appl. No. 13/362,955, Response filed Jan. 16, 2015 to Final Office Action mailed Nov. 19, 2014", 9 pgs.
"U.S. Appl. No. 13/363,537, Corrected Notice of Allowance mailed Jan. 28, 2015", 2 pgs.
"U.S. Appl. No. 13/821,586, Non Final Office Action mailed Jan. 15, 2015", 8 pgs.
"U.S. Appl. No. 13/821,598, Response filed Feb. 20, 2015 to Non Final Office Action mailed Nov. 20, 2014", 12 pgs.
"U.S. Appl. No. 13/821,609, Response filed Feb. 13, 2015 to Restriction Requirement mailed Dec. 15, 2014", 6 pgs.
"U.S. Appl. No. 13/821,609, Restriction Requirement mailed Dec. 15, 2014", 7 pgs.
"U.S. Appl. No. 13/821,612, Notice of Allowance mailed Dec. 10, 2014", 8 pgs.
"U.S. Appl. No. 13/821,853, Non Final Office Action mailed Feb. 18, 2015", 15 pgs.
"U.S. Appl. No. 13/821,853, Response filed Dec. 1, 2014 to Non Final Office Action mailed Jul. 30, 2014", 10 pgs.
"U.S. Appl. No. 13/860,761, Final Office Action mailed Jan. 15, 2015", 14 pgs.
"U.S. Appl. No. 13/860,761, Response filed Dec. 19, 2014 to Non Final Office Action mailed Aug. 19, 2014", 12 pgs.
"Chinese Application Serial No. 2010800423190, Office Action mailed Dec. 3, 2014", 3 pgs.
"Chinese Application Serial No. 2010800423190, Response filed Feb. 15, 2015", 3 pgs.
"Chinese Application Serial No. 201180054796.3, Office Action mailed Jan. 30, 2015", with English translation of claims, 5 pgs.

(56) References Cited

OTHER PUBLICATIONS

"Chinese Application Serial No. 201180054796.3, Response filed Nov. 19, 2014 to Office Action mailed Sep. 4, 2014", with English translation of claims, 7 pgs.
"Chinese Application Serial No. 201180055309.5, Office Action mailed Jan. 8, 2015", with English translation of claims, 5 pgs.
"Chinese Application Serial No. 201180055309.5, Response filed Jan. 14, 2015 to Office Action mailed Jan. 8, 2015", 8 pgs.
"Chinese Application Serial No. 201180055630.3, Office Action mailed Dec. 22, 2014", with English translation of claims, 10 pgs.
"Chinese Application Serial No. 201180055792.7, Office Action mailed Dec. 22, 2014", with English translation of claims, 10 pgs.
"Chinese Application Serial No. 201180055794.6, Office Action mailed Dec. 17, 2014", with English translation of claims, 9 pgs.
"Chinese Application Serial No. 2013101188456, Response filed Jan. 21, 2015", with English translation of claims, 16 pgs.
"Chinese Application Serial No. 201310119472.4, Response filed Jan. 21, 2015", with English translation of claims, 16 pgs.
"Chinese Application Serial No. 201380007588.7, Response filed Oct. 24, 2014", with English translation, 3 pgs.
"Chinese Application Serial No. 201380007615.0, Response filed Oct. 24, 2014", with English translation, 3 pgs.
"European Application Serial No. 11826068.6, Response filed Feb. 9, 2015", 30 pgs.
"European Application Serial No. 11826071.0, Examination Notification Art. 94(3) mailed Dec. 11, 2014", 4 pgs.
"European Application Serial No. 13001695.9, Extended European Search Report mailed Jan. 22, 2015", 8 pgs.
"European Application Serial No. 13001719.7, Response filed Jan. 21, 2015", 29 pgs.
"U.S. Appl. No. 13/362,955, Final Office Action mailed Nov. 19, 2014", 5 pgs.
"U.S. Appl. No. 13/362,955, Response filed Aug. 15, 2014 to Non Final Office Action mailed May 15, 2014", 13 pgs.
"U.S. Appl. No. 13/363,537, Examiner Interview Summary mailed Sep. 29, 2014", 3 pgs.
"U.S. Appl. No. 13/363,537, Notice of Allowance mailed Nov. 7, 2014", 5 pgs.
"U.S. Appl. No. 13/363,537, Response filed Sep. 29, 2014 to Final Office Action mailed Jun. 27, 2014", 9 pgs.
"U.S. Appl. No. 13/821,586, Response filed Nov. 24, 2014 to Restriction Requirement mailed Sep. 22, 2014", 6 pgs.
"U.S. Appl. No. 13/821,586, Restriction Requirement mailed Sep. 22, 2014", 4 pgs.
"U.S. Appl. No. 13/821,589, Response filed Nov. 10, 2014 to Non Final Office Action mailed Jul. 9, 2014", 15 pgs.
"U.S. Appl. No. 13/821,598, Non Final Office Action mailed Nov. 20, 2014", 9 pgs.
"U.S. Appl. No. 13/821,598, Response filed Oct. 15, 2014 to Restriction Requirement mailed Aug. 15, 2014", 8 pgs.
"U.S. Appl. No. 13/821,612, Response filed Oct. 23, 2014 to Non Final Office Action mailed Jul. 23, 2014", 6 pgs.
"Chinese Application Serial No. 201180054796.3, Office Action mailed Sep. 4, 2014", w/English Claims, 11 pgs.
"Chinese Application Serial No. 201180055029.4, Response filed Nov. 14, 2014 to Office Action mailed Jul. 2, 2014", w/English Claims, 23 pgs.
"Chinese Application Serial No. 201310118845.6, Office Action mailed Sep. 9, 2014", 8 pgs.
"Chinese Application Serial No. 201310119472.4, Office Action mailed Sep. 9, 2014", w/English Translation, 11 pgs.
"European Application Serial No. 11826043.9, Office Action mailed May 6, 2013", 2 pgs.
"European Application Serial No. 11826043.9, Response filed Nov. 4, 2013 to Office Action mailed May 6, 2013", 6 pgs.
"European Application Serial No. 11826067.8, Extended European Search Report mailed Oct. 6, 2014", 10 pgs.
"European Application Serial No. 11826070.2, Response filed Sep. 19, 2014 to Office Action mailed Mar. 12, 2014", 11 pgs.
"European Application Serial No. 11826071.0, Response filed Sep. 19, 2014 to Office Action mailed Mar. 12, 2014", 20 pgs.
"European Application Serial No. 11827347.3, Office Action mailed May 2, 2013", 6 pgs.
"European Application Serial No. 11827347.3, Response filed Oct. 30, 2013 to Office Action mailed May 2, 2013", 9 pgs.
"European Application Serial No. 11827384.6, Extended European Search Report mailed Nov. 12, 2014", 6 pgs.
"European Application Serial No. 13001695.9, European Search Report mailed Oct. 5, 2014", 6 pgs.
Dunn, C, et al., "Efficient linearisation of sigma-delta modulators using single-bit dither", Electronics Letters 31(12), (Jun. 1995), 941-942.
Kulah, Haluk, et al., "Noise Analysis and Characterization of a Sigma-Delta Capacitive Silicon Microaccelerometer", 12th International Conference on Solid State Sensors, Actuators and Microsystems, (2003), 95-98.
Sherry, Adrian, et al., "AN-609 Application Note: Chopping on Sigma-Delta ADCs", Analog Devices, [Online]. Retrieved from the Internet: <URL: http://www.analog.com/static/imported-files/application_notes/AN-609.pdf>, (2003), 4 pgs.
"U.S. Appl. No. 13/742,994, Response filed Jul. 31, 2015 to Non Final Office Action mailed May 1, 2015", 12 pgs.
"U.S. Appl. No. 13/765,068, Notice of Allowance mailed May 7, 2015", 12 pgs.
"U.S. Appl. No. 13/813,443, Non Final Office Action mailed Jun. 10, 2015", 10 pgs.
"U.S. Appl. No. 13/813,443, Response filed May 22, 2015 to Restriction Requirement mailed Apr. 29, 2015", 7 pgs.
"U.S. Appl. No. 13/821,586, Notice of Allowance mailed Jun. 5, 2015", 6 pgs.
"U.S. Appl. No. 13/821,586, Response filed May 15, 2015 to Non Final Office Action mailed Jan. 15, 2015", 12 pgs.
"U.S. Appl. No. 13/821,589, Final Office Action mailed Jul. 17, 2015", 14 pgs.
"U.S. Appl. No. 13/821,589, response filed May 12, 2015 to final office action mailed Mar. 12, 2015", 12 pgs.
"U.S. Appl. No. 13/821,598, Non Final Office Action mailed Jul. 7, 2015", 9 pgs.
"U.S. Appl. No. 13/821,619, Ex Parte Quayle Action mailed Jul. 16, 2015", 8 pgs.
"U.S. Appl. No. 13/821,793, Non Final Office Action mailed Jul. 27, 2015", 14 pgs.
"U.S. Appl. No. 13/821,842, Response filed Jun. 18, 2015 Non Final Office Action mailed Mar. 18, 2015", 11 pgs.
"U.S. Appl. No. 13/821,853, Final Office Action mailed Jun. 18, 2015", 7 pgs.
"U.S. Appl. No. 13/821,853, Response filed May 18, 2015 to Non Final Office Action mailed Feb. 18, 2015", 12 pgs.
"U.S. Appl. No. 14/023,869, Non Final Office Action mailed Jun. 15, 2015", 15 pgs.
"U.S. Appl. No. 14/658,579, Non Final Office Action mailed Jul. 1, 2015", 9 pgs.
"Chinese Application Serial No. 201180044919.5, Office Action mailed Jun. 25, 2015", w/ English Translation, 8 pgs.
"Chinese Application Serial No. 201180054796.3, Office Action mailed Jun. 4, 2015", w/ English Translation, 7 pgs.
"Chinese Application Serial No. 201180054796.3, Response filed Apr. 14, 2015 to Office Action mailed Jan. 30, 2015", w/ English Claims, 30 pgs.
"Chinese Application Serial No. 201180055630.3, Office Action mailed Jul. 10, 2015", w/ English Claims, 8 pgs.
"Chinese Application Serial No. 201180055630.3, Response filed Apr. 20, 2015 to Office Action mailed Dec. 22, 2014", w/ English Claims, 10 pgs.
"Chinese Application Serial No. 201180055792.7, Response filed May 5, 2015 to Office Action mailed Dec. 22, 2014", w/ English Claims, 15 pgs.
"Chinese Application Serial No. 201180055794.6, Response filed May 4, 2015 to Office Action mailed Dec. 17, 2014", w/ English Claims, 15 pgs.
"Chinese Application Serial No. 201180055845.5, Office Action mailed Aug. 5, 2015", 5 pgs.

(56) References Cited

OTHER PUBLICATIONS

"Chinese Application Serial No. 201310115550.3, Office Action mailed May 22, 2015", w/ English Claims, 8 pgs.
"Chinese Application Serial No. 201310119730.9, Office Action mailed May 4, 2015", w/ English Claims, 8 pgs.
"Chinese Application Serial No. 201310119806.8, Office Action mailed Jul. 3, 2015", w/ English Claims, 12 pgs.
"Chinese Application Serial No. 201310119986.X, Office Action mailed May 12, 2015", w/ English Claims, 14 pgs.
"Chinese Application Serial No. 201310127961.4, Office Action mailed May 6, 2015", w/ English Claims, 7 pgs.
"Chinese Application Serial No. 201310128046.7, Office Action mailed Jul. 23, 2015", 7 pgs.
"Chinese Application Serial No. 201310415336.X, Office Action mailed Jul. 3, 2015", w/ English Claims, 9 pgs.
"Chinese Application Serial No. 201380007588.7, Office Action mailed Jun. 10, 2015", w/ English Claims, 7 pgs.
"Chinese Application Serial No. 201380007615.0, Office Action mailed May 6, 2015", w/ English Claims, 7 pgs.
"European Application Serial No. 11826067.8, Response filed Apr. 27, 2015 to Extended European Search Report mailed Oct. 6, 2014", 32 pgs.
"European Application Serial No. 11826069.4, Extended European Search Report mailed Jul. 23, 2015", 8 pgs.
"European Application Serial No. 11826071.0, Response filed Apr. 13, 2015 to Examination Notification Art. 94(3) mailed Dec. 11, 2014", 5 pgs.
"European Application Serial No. 11827347.3, Extended European Search Report mailed Jul. 31, 2015", 6 pgs.
"Korean Application Serial No. 10-2013-0036907, Amendment filed Jul. 21, 2015", Not in English, 12 pgs.

\* cited by examiner

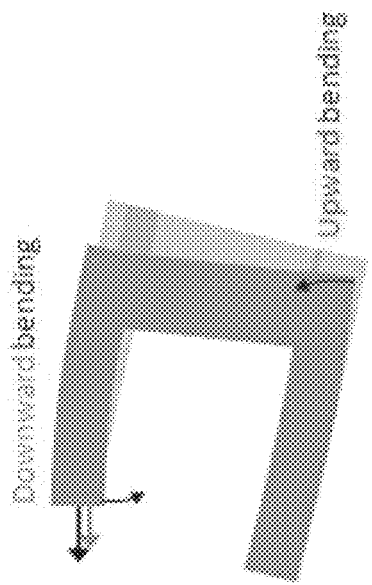
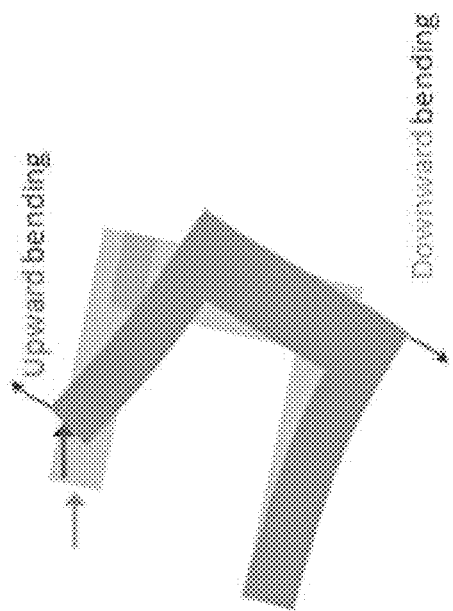
FIG. 2B
FIG. 2C
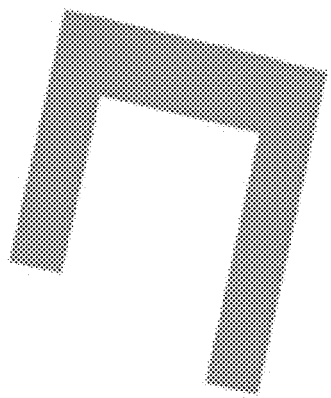
FIG. 2A

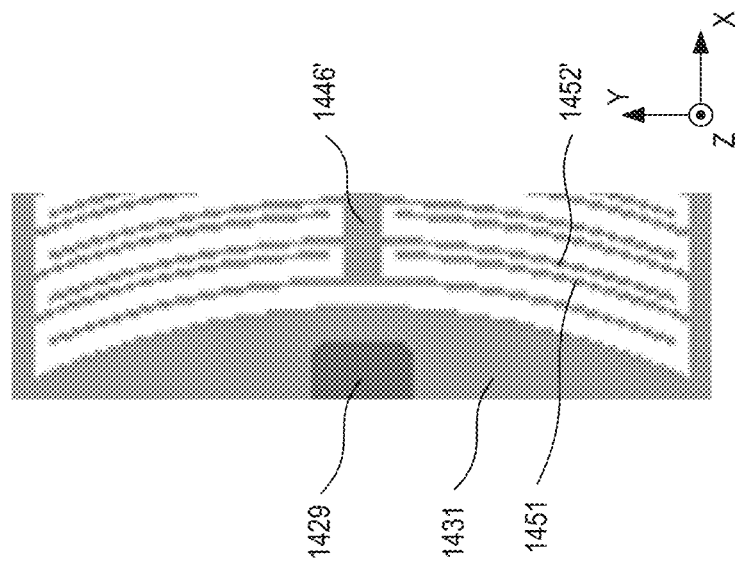
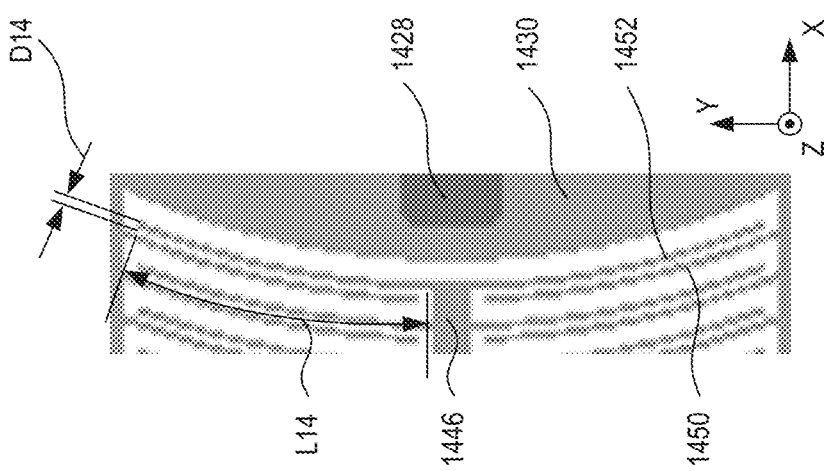
FIG. 14C
FIG. 14D

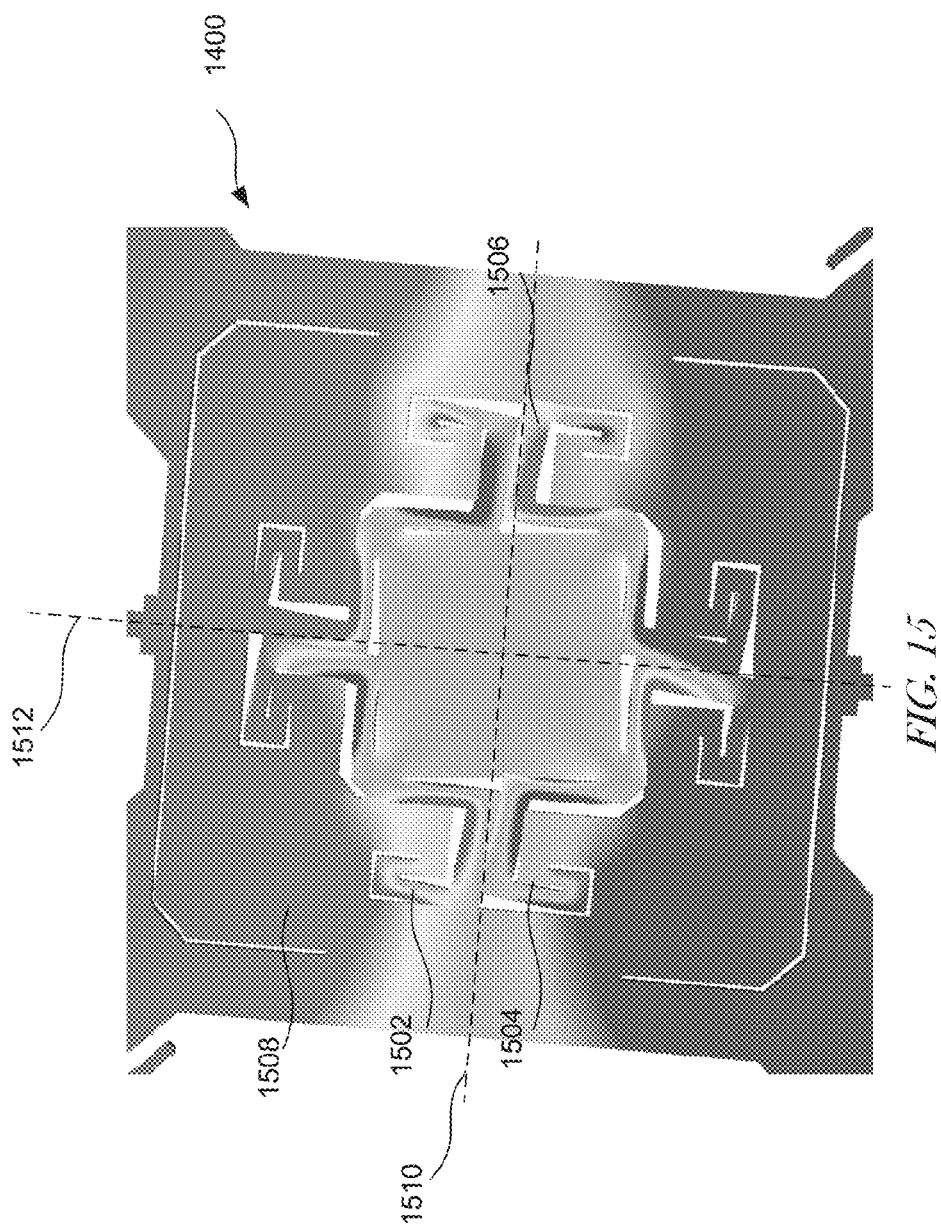

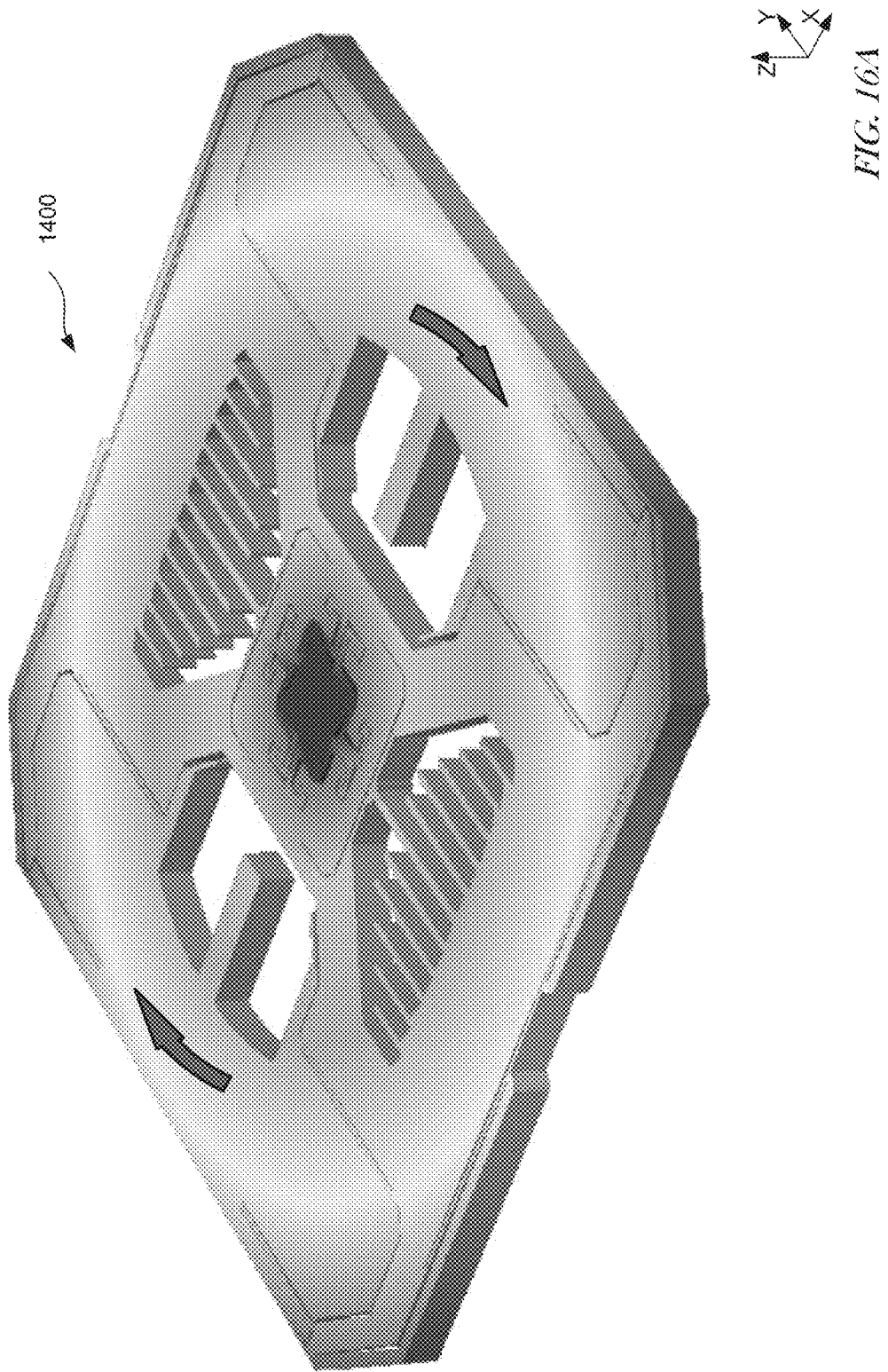

MEMS MULTI-AXIS GYROSCOPE Z-AXIS ELECTRODE STRUCTURE

CLAIM OF PRIORITY

This application is a continuation-in-part of and claims the benefit of priority under 35 U.S.C. §120 to U.S. patent application Ser. No. 13/813,443, filed on Jan. 31, 2013, which is a U.S. National Stage Filing under 35 U.S.C. 371 from International Patent Application Serial No. PCT/US2011/052006, filed on Sep. 16, 2011, and published on Mar. 22, 2012 as WO 2012/037501 A2, which claims the benefit of priority of U.S. Provisional Patent Application Ser. No. 61/384,247, entitled "LOW-QUADRATURE SUSPENSION SYSTEM FOR MULTI-AXIS GYROSCOPES," filed Sep. 18, 2010 and U.S. Provisional Patent Application Ser. No. 61/384,512, entitled "IMPROVED QUADRATURE REDUCTION STRUCTURE FOR RESONATING MICROMACHINED DEVICES," filed Sep. 20, 2010, each of which is incorporated by reference in its entirety.

This application also claims the benefit of priority of U.S. Provisional Patent Application Ser. No. 61/593,691, entitled "MEMS MULTI-AXIS GYROSCOPE WITH CENTRAL SUSPENSION AND GIMBAL STRUCTURE," filed on Feb. 1, 2012, which is incorporated by reference herein in its entirety.

BACKGROUND

Quadrature error is one of the primary factors that limit the performance of micromachined sensors such as gyroscopes. Considering the relative magnitudes of the drive and sense oscillations, even an extremely small part of the drive motion coupling into a sense-mode could dominate over the Coriolis response.

Practically, fabrication imperfections may result in less-than-ideal geometries in structures such as gyroscope structures. Less-than-ideal geometries can cause a drive oscillation to partially couple into a sense-mode. Even though several cross-coupling approaches exist, such as elastic, viscous and electrostatic coupling approaches, in certain cases the elastic coupling due to anisoelasticity in the suspension elements increases in magnitude beyond a desired level.

In sensor systems such as gyroscope systems with out-of-plane operational modes, anisoelasticity between the in-plane and out-of-plane directions is the dominating source of Quadrature error. Sidewall tilt or skew in deep reactive-ion etching ("DRIE") can result in deviation of the cross-section of the flexure bearings from a rectangle to a parallelogram, causing the principle axes of elasticity of the suspension flexure bearings to deviate from parallel and orthogonal to the device surface. In an example, single or multi-axis micromachined sensor structures such as gyroscope structures can suffer from high-quadrature error caused at least in part by DRIE skew.

Additionally, prior resonators rely on simple straight flexure bearings to generate a flexing structure to allow the device to displace in resonance. This creates significant problems when etching creates a skew in the flexure bearing, causing large undesired displacement, often actuating a sense mechanism.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 2A illustrates a portion of a suspension, according to an example.

FIG. 2B illustrates the suspension of FIG. 8A, in a bending state in which a top portion is bent upward, in an example.

FIG. 2C illustrates the suspension of FIG. 8A, in a bending state in which a top portion is bent downward, in an example.

FIG. 14C illustrates a sectional taken at 14C of FIG. 14A.

FIG. 14D illustrates a sectional taken at 14D of FIG. 14A.

FIG. 15 illustrates the suspension of FIG. 14 flexed in torsion around a Z-axis, according to an example.

FIG. 16A illustrates the suspension of FIG. 14 flexed in torsion around a Z-axis, according to an example.

DETAILED DESCRIPTION

Unwanted sidewall flex can negatively affect the performance of flexure bearings ("flexures"), such as flexure bearings that support one or more portions of a microelectromechanical systems ("MEMS") structure such as a die. In an example, if one or more sidewalls have an angle error, an in-plane drive motion can cause out-of-plane motion, such as when the skew axis is along a flexure bearing or beam length.

In an example, when skewed pliable or compliant flexure bearings or beams are located on opposite sides during a drive motion, a resulting out-of-plane deflection can cause or contribute to quadrature error. In an example, a low-quadrature suspension system aims at reducing or cancelling undesired out-of-plane motion.

Figure 1:
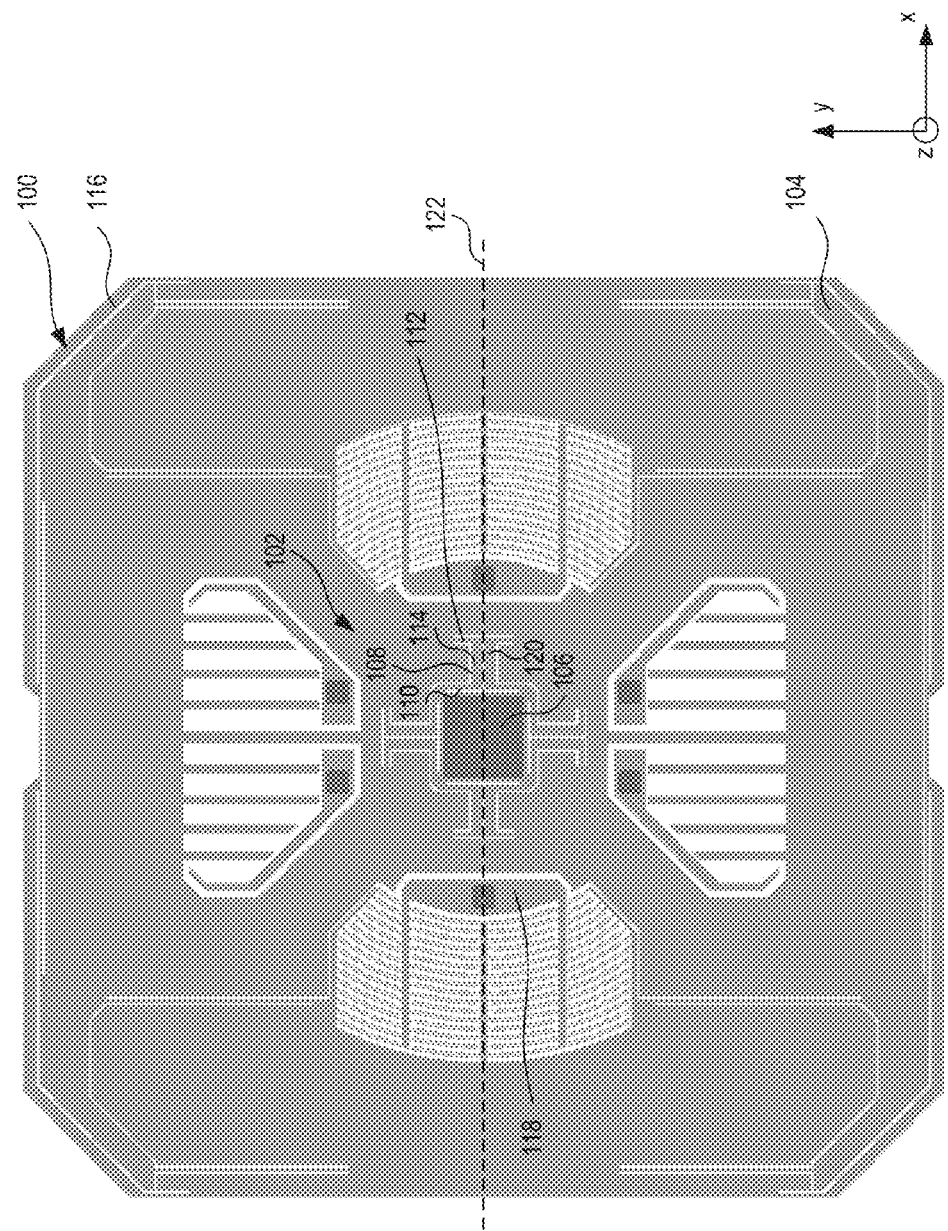
FIG. 1 illustrates a sensor structure including a suspension structure, according to an example.

FIG. 1 illustrates a sensor structure including a suspension structure, according to an example. Various examples disclose a low-quadrature suspension system for a sensor. In an example, a suspension structure can be utilized in a torsional multi-axis micromachined gyroscope system with a proof-mass such as a single proof-mass 104. In an example, a proof-mass 104 is suspended at its center with a single central anchor 106. In an example, one or more flexure bearings connect the anchor 106 to the proof-mass 104, such as to the proof-mass main frame 116. In an example, one or more flexures allow the proof-mass to oscillate torsionally about three perpendicular axes. In an example, suspension flexure bearings or beams provide in-plane and out-of-plane deflections, allowing the proof-mass to oscillate torsionally about the x, y, and z axes.

An example includes a fixed portion 118, wherein the anchor 106 is coupled to the fixed portion 118. In an example, a first nonlinear suspension member 108 is coupled to anchor 106 on a side of the anchor. In an example, a second nonlinear suspension member 120 coupled to the anchor on the same side of the anchor, the second nonlinear suspension member having a shape and location mirroring the first nonlinear suspension member about an anchor bisecting plane 122, such as a x-Z-plane. Various examples include a proof-mass 104 that is planar, the proof-mass suspended at least in part by the first nonlinear suspension member 108 and the second nonlinear suspension member 120 such that the proof-mass is rotable about the anchor 106 and is slideable in a plane parallel to the fixed portion, such as in the x-y plane.

In an example, a C-shaped flexure bearing 108 includes a inner portion 110 coupled to the anchor 106 and extending toward the anchor bisecting plane 122, a center portion 114 having a proximal portion and a distal portion, with a proximal portion coupled to the inner portion 110 and a distal portion extending away from the anchor 106 along the anchor bisecting plane 122 and coupled to a outer portion 112 extending away from the anchor bisecting plane 122. In an example, the center portion 114 is perpendicular the inner portion 110 and the outer portion 112. In an examples, the center portion 114 is parallel the anchor bisecting plane 122.

In an examples, the anchor 106, the first nonlinear suspension member 108, the second nonlinear suspension member 120 and the proof-mass 104 are formed of a monolithic material. In an example, the fixed portion 118 comprises a fixed monolithic material other than the monolithic material of the anchor 106, the first nonlinear suspension member 108, the second nonlinear suspension member 120 and the proof-mass 104. In an example, the fixed portion 118 comprises a fixed monolithic material the same as the monolithic material of the anchor 106, the first nonlinear suspension member 108, the second nonlinear suspension member 120 and the proof-mass 104.

In an example, flexure bearings are disposed on each side of the central anchor, such as on opposite sides of the anchor. In an example, out-of-plane motion caused by each C-shaped flexure bearing on a side is cancelled out by its symmetric counterpart. Accordingly, in an example, the quadrature error induced on each flexure bearing is locally reduced or cancelled.

In an example, a central suspension structure 102 is utilized in a sensor, such as a 6 degree of freedom ("DOF") sensor 100, such as a monolithic 6-DOF sensor, that is comprised of symmetric flexures bearings. In an example, the symmetric flexure bearings include "C-shaped flexure bearings" 108. In an example, each C-shaped flexure bearing includes inner 110 and outer 112 flexure bearings and a high-stiffness connection flexure bearing 114 between two flexure bearings. In an example, the inner flexure bearing 112 is connected to the anchor 106 on one end, and the outer flexure bearing 112 is connected to the proof-mass 104 on another end. In an example, the suspension system 102 is formed by a total of eight C-shaped flexure bearings 108. In an example, two symmetric C-shaped flexure bearings are located on each of the four sides of a central anchor structure.

In an example, a suspension system provides three gyroscope operational modes: torsional in-plane about the Z-axis for the drive motion; torsional out-of-plane about the X-axis for the Y-axis gyroscope sense motion; and torsional out-of-plane about the Y-axis for the X-axis gyroscope sense motion. In an example, the oscillation modes can be switched between each other.

FIG. 2A illustrates a portion of a suspension, according to an example. FIG. 2B illustrates the suspension of FIG. 2A, in a bending state in which a top portion is bent upward, in an example. FIG. 2C illustrates the suspension of FIG. 2A, in a bending state in which a top portion is bent downward, in an example. The examples shown illustrate the deformation profile in each direction of the suspension mechanism. In an example, bending occurs equal and opposite in both deformation cases illustrates in FIG. 2B and FIG. 2C. In an example, in each direction the two flexure bearings bend in opposite ways. In an example, by creating opposing out-of-plane deformations that cancel each other, the overall out-of-plane deformation from one end of the flexure to the other is minimized.

Figure 3:
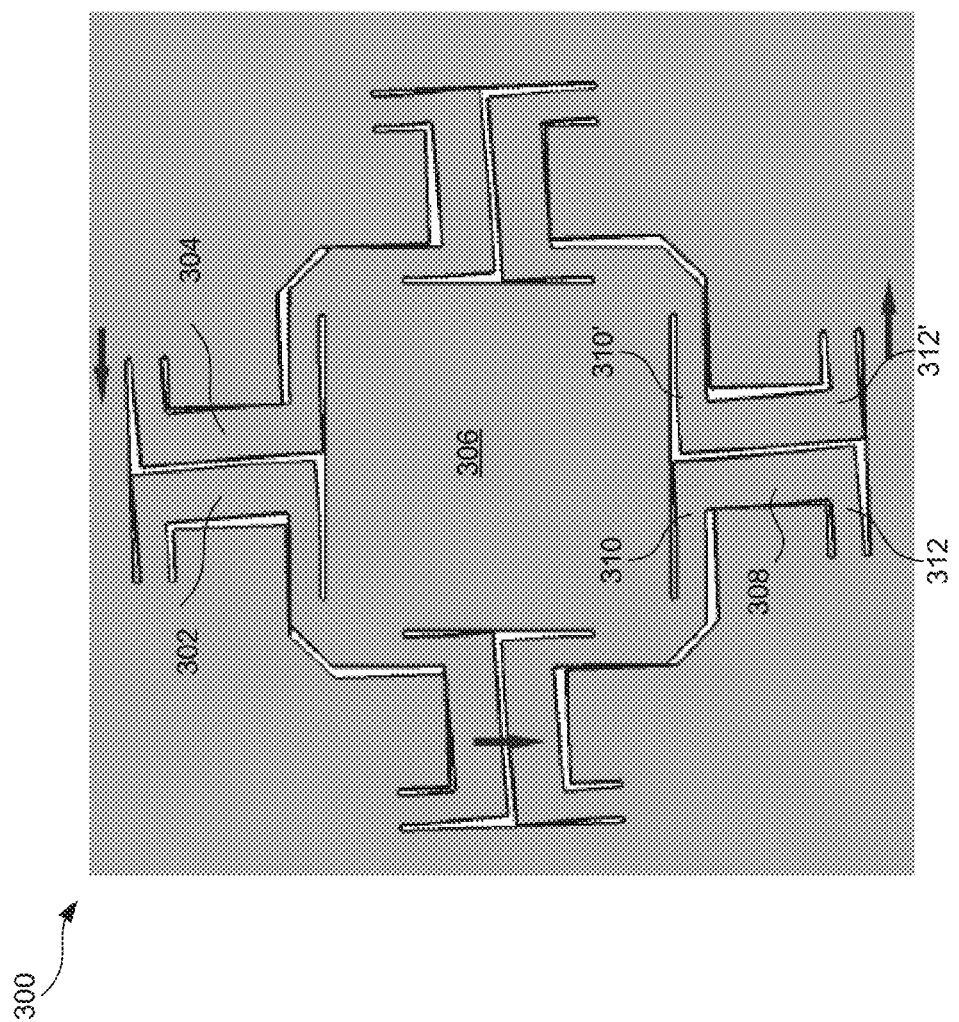
FIG. 3 illustrates torsional motion of a suspended structure about a Z-axis, according to an example.

FIG. 3 illustrates torsional motion of a suspended structure about a Z-axis, according to an example. In an example, a suspension system 300 comprises two symmetric C-shaped flexure bearings 302, 304 on each side of a central anchor structure 306. In an example, one or both of the C-shaped flexure bearings 302, 304 is formed of a high-stiffness connection flexure bearing 308 disposed between two flexure bearings 310, 312. In an example, during in-plane torsional motion, such as motion parallel to the plane of the figure, the out-of-plane motion caused by the deflection of the flexure bearings in each C-shaped flexure bearing on a side is cancelled out by a symmetric counterpart 310', 312'. Accordingly, quadrature error induced on each flexure bearing is locally reduced or cancelled.

The illustrated example illustrates torsional motion about a Z-Axis, i.e. an axis extending into and out of the page. In an example, during the in-plane torsional motion, the inner 310 and outer 312 flexure bearings in each C-shaped flexure bearing bend in-plane. In an example, the high-stiffness connection bearings 308 do not experience significant bending. For a counterclockwise rotation of the proof-mass about the Z-axis, top part of the proof-mass moves left as shown. In an example, the high-stiffness connection bearings both move left. As a result, the inner and outer flexures on the right C-shaped flexure bearing bend down, while the ones on the left C-shaped flexure bearing bend up. Thus, in an example, the motion results in deflections in opposite directions in the symmetric C-shaped flexure bearing flexures. Since the flexures in symmetric C-shaped flexure bearings deflect in opposite directions, the out-of-plane motion caused by the deflection of the flexure bearings in each C-shaped flexure bearing on a side is cancelled out by its symmetric counterpart. Thus, the quadrature error induced on each flexure bearing is locally cancelled.

Figure 4:
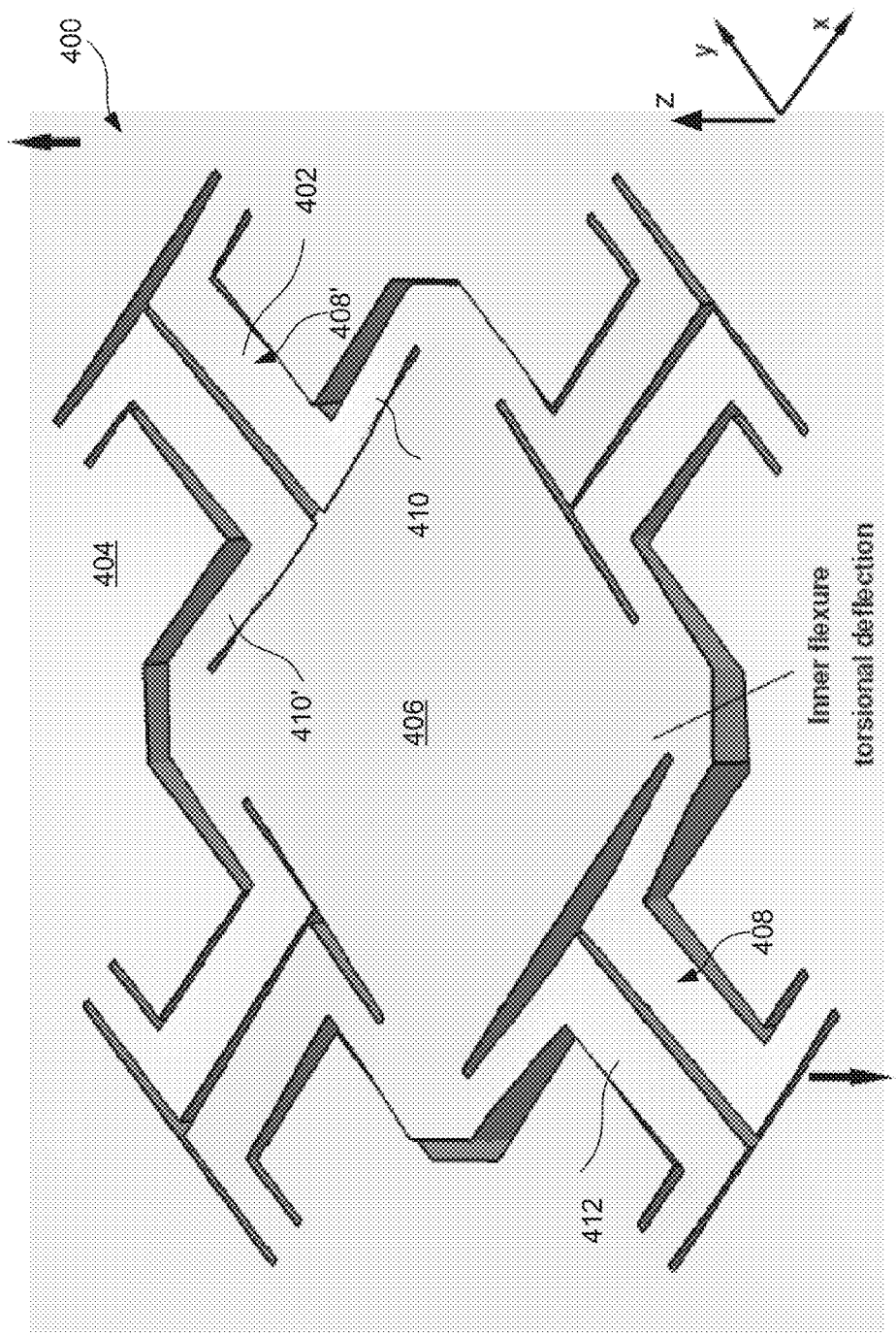
FIG. 4 illustrates torsional motion of a suspended structure about an X-axis, according to an example.

FIG. 4 illustrates torsional motion of a suspended structure about an X-axis, according to an example. In an example, a suspension structure can be utilized in a torsional multi-axis micromachined gyroscope system with a proof-mass such as a single proof-mass 404. In an example, a proof-mass 404 is suspended at its center with a single central anchor 406. In an example, one or more flexure bearings 402 connect the anchor 406 to the proof-mass 404. In an example, during the out-of-plane torsional motion about the X-axis, primarily the C-shaped suspension pairs 412, 412' on the Y-axis sides of the anchor deflect. In an example, the inner flexure bearings 410, 410' in these C-shaped suspensions bend torsionally about the X-axis, acting as a torsional hinge.

In an example, the die is wafer shaped, with each of a first nonlinear suspension member 408 and a second nonlinear suspension member 412 having a substantially rectangular cross-section with the height of the cross-section smaller than the width.

Figure 5:
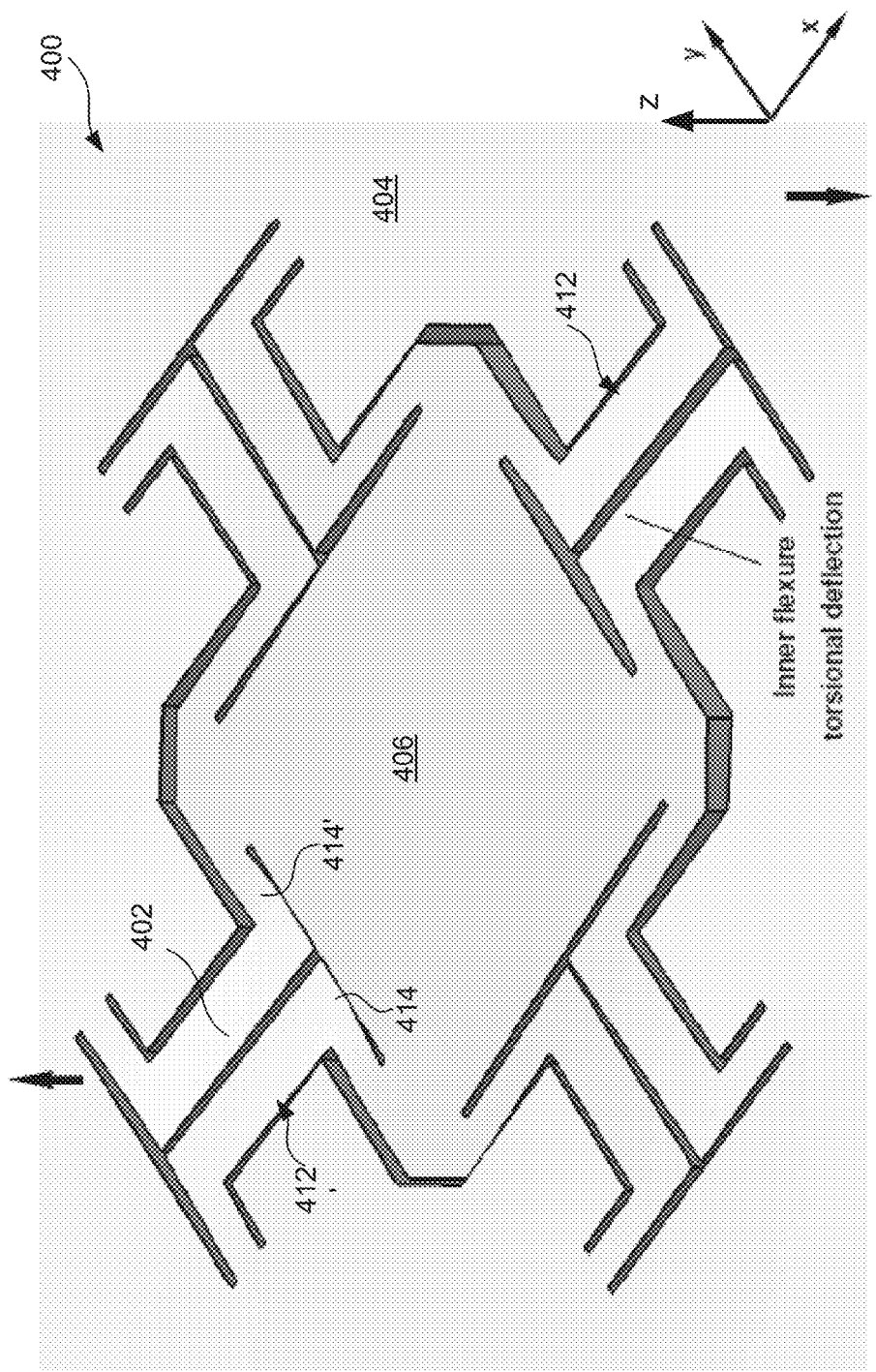
FIG. 5 illustrates torsional motion of a suspended structure about a Y-axis, according to an example.

FIG. 5 illustrates torsional motion of a suspended structure about a Y-axis, according to an example. In an example, a suspension structure can be utilized in a torsional multi-axis micromachined gyroscope system with a proof-mass such as a single proof-mass 404. In an example, a proof-mass 404 is suspended at its center with a single central anchor 406. In an example, one or more flexure bearings 402 connect the anchor 406 to the proof-mass 404. In an example, during the out-of-plane torsional motion about the Y-axis, primarily the C-shaped suspension pairs 412, 412' on the X-axis sides of the anchor deflect. The inner flexure bearings in these C-shaped flexure bearings 414, 414' bend torsionally about the Y-axis, acting as a torsional hinge.

Figure 6:
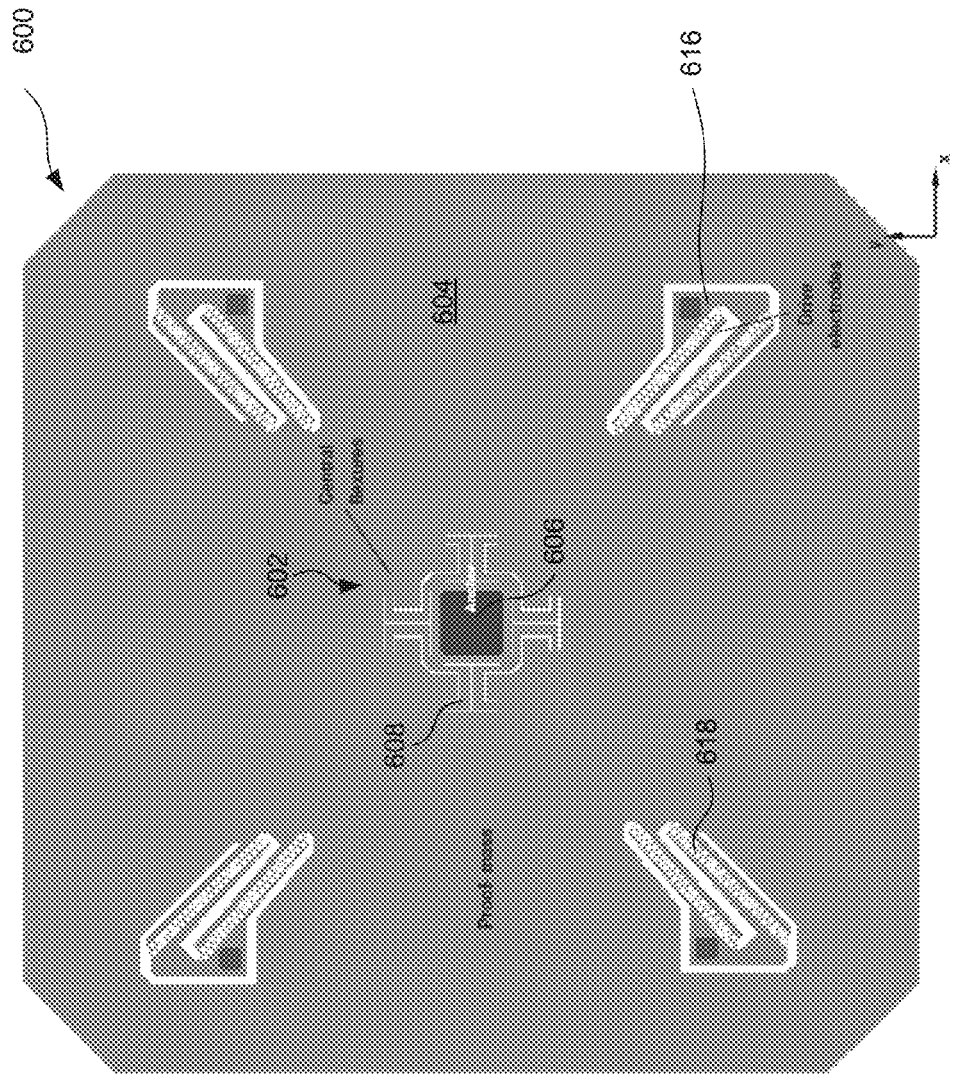
FIG. 6 illustrates a 2-Axis Gyroscope including a low quadrature error suspension, according to an example.

FIG. 6 illustrates a 2-Axis Gyroscope including a low quadrature error suspension, according to an example. In an example, a structure 602 can be utilized in various torsional multi-axis micromachined gyroscope systems with a single proof-mass 604 that is suspended at its center with a single central anchor 606. The flexures 608 connect the anchor to the proof-mass 604, and allow the proof-mass to oscillate torsionally about all three axes. The illustrated example senses motion about each of the X-axis and the Y-axis, and proves three gyroscope operational modes: torsional in-plane about the Z-axis for the drive motion; torsional out-of-plane about the X-axis for the Y-axis gyroscope sense motion; and torsional out-of-plane about the Y-axis for the X-axis gyroscope sense motion. In an example, one or more comb electrodes 616 are coupled to a fix portion of the device and sense motion of comb electrodes 618 coupled to the proof-mass 604. In an example, the comb teeth of the comb electrodes 618 are disposed along an axis that bisects an angle between the X-axis and the X-axis.

Figure 7:
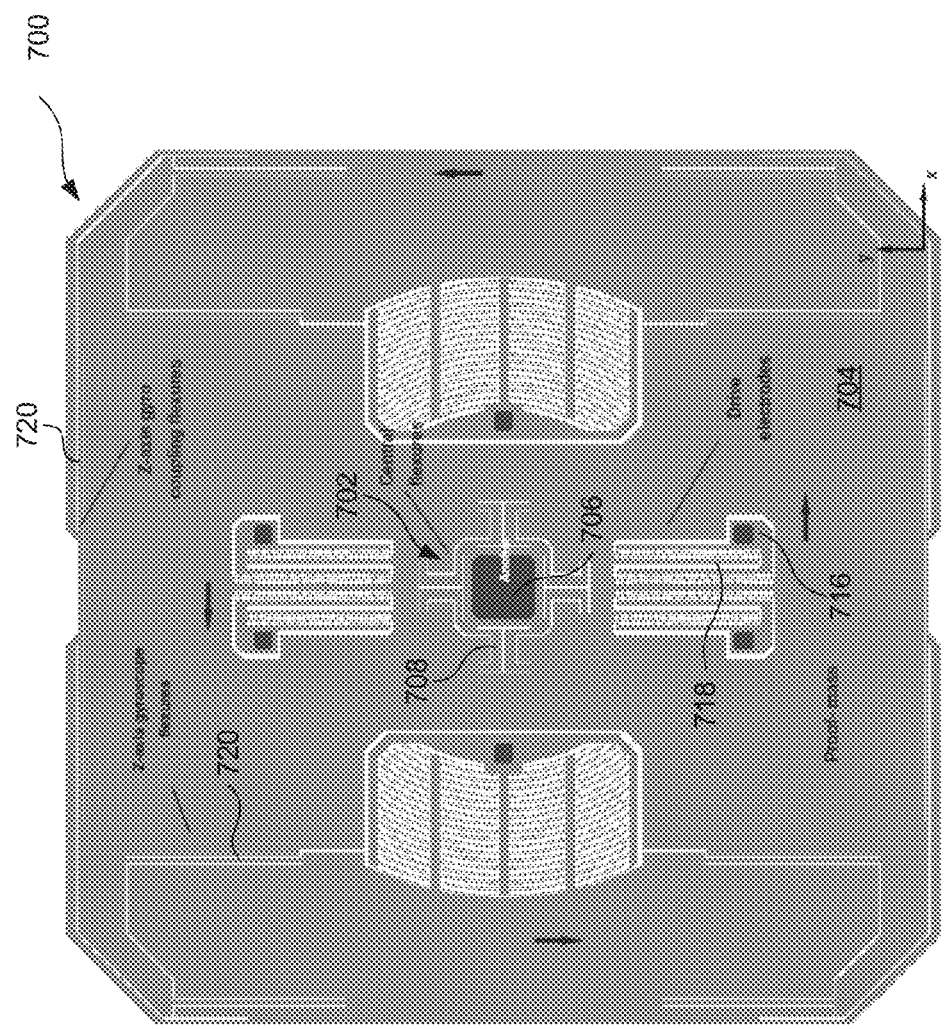
FIG. 7 illustrates a 3-Axis Gyroscope including a low quadrature error suspension, according to an example.

FIG. 7 illustrates a 3-Axis Gyroscope including a low quadrature error suspension, according to an example. In an example, a structure 702 can be utilized in various torsional multi-axis micromachined gyroscope systems with a single proof-mass 704 that is suspended at its center with a single central anchor 706. The flexures 708 connect the anchor to the proof-mass 704, and allow the proof-mass to oscillate torsionally about all three axes. In an example, a device function as an a three-axis ("X/Y/Z") gyroscope. In an example, the suspension system 702 provides similar gyroscope operational modes to the device illustrated in FIG. 6. In an example, the illustrated device of FIG. 7 includes additional flexures 720 that provide for the Z-axis sense mode. In an example, one or more comb electrodes 716 are coupled to a fix portion of the device and sense motion of comb electrodes 718 coupled to the proof-mass 704. In an example, the comb teeth of the comb electrodes 718 are disposed along an axis that bisects an angle between the X-axis and the X-axis.

Figure 8:
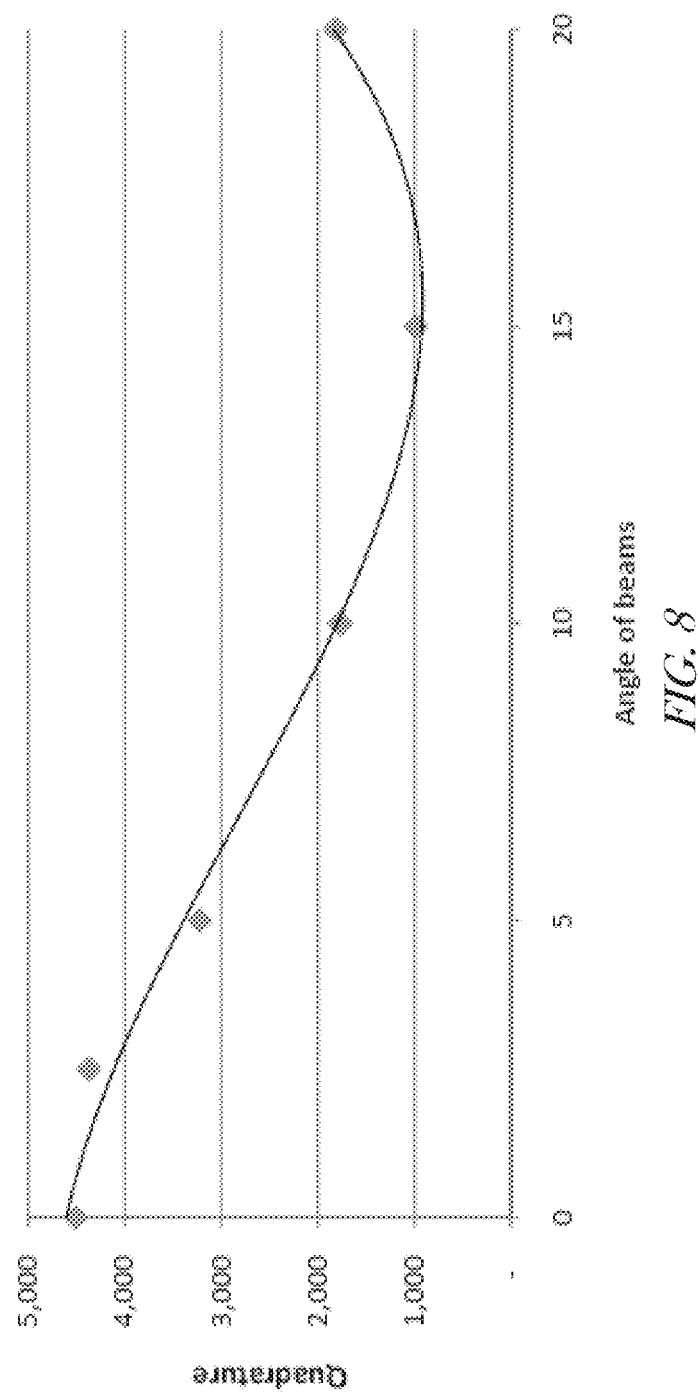
FIG. 8 illustrates quadrature error for an example suspension.

FIG. 8 illustrates quadrature error for an example suspension. In an example, the angle of the flexure bearings has a significant effect on the quadrature. In an example, for each design the angle can be chosen to optimize the quadrature error arising from skew of the resonator flexure bearing flexures. In an example, for the desired implementation of the suspension system, the optimal angle is 15 degrees. In an example, the optimal angle is structure shape dependent, and is selected based on the structure of a respective device. In an example, for a desired structure, two flexure bearings are set at the same angular shift, but two flexure bearings could easily be set at different angles.

Figure 9:
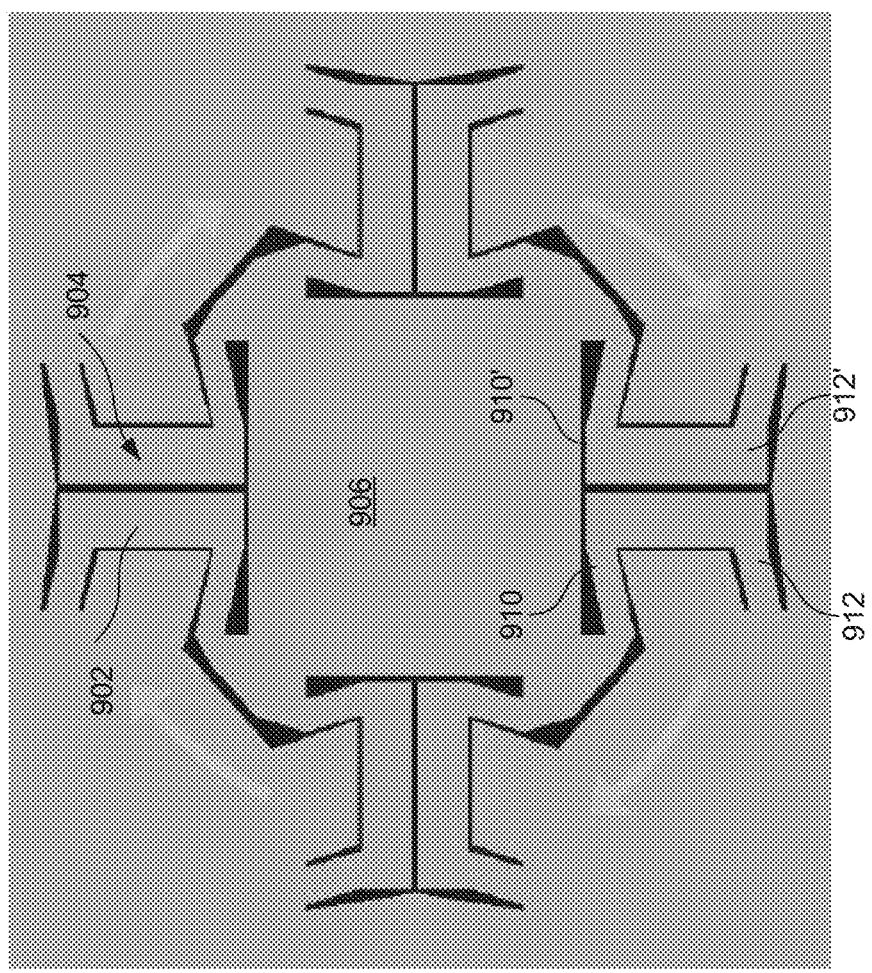
FIG. 9 illustrates a drive mode, according to an example.

FIG. 9 illustrates a drive mode, according to an example. The inventors recognized that skew effect creates quadrature errors in suspension configurations including an anchor 906, and that they could minimize the effect by creating opposite skews on the same flexure 902 or flexure pair 904. Accordingly, there are two flexing flexure bearings separated by a frame, each of which deforms in the opposite direction in the drive mode of operation. The opposite directions of the deformation cause the skew to create out-of-plane deformation in opposite directions, which cancel each other out at the final connection to the moving component. This is used to replace an existing mechanism which only includes one flexure bearing, the skew of which causes deformation in only one direction, creating a lot of out-of-plane motion without any canceling.

However, in some examples, the inner 910, 910' and outer 912, 912' flexure bearings are rotated so that deformation causes one flexure bearing to bend up and one flexure bearing to bend downward during drive mode actuation. In an example, the drive mode is a rotational mode about a central anchor. In an example, for each of the four suspension pairs 404, the drive mode causes one to deform in one direction and the other in the other direction.

Figure 10:
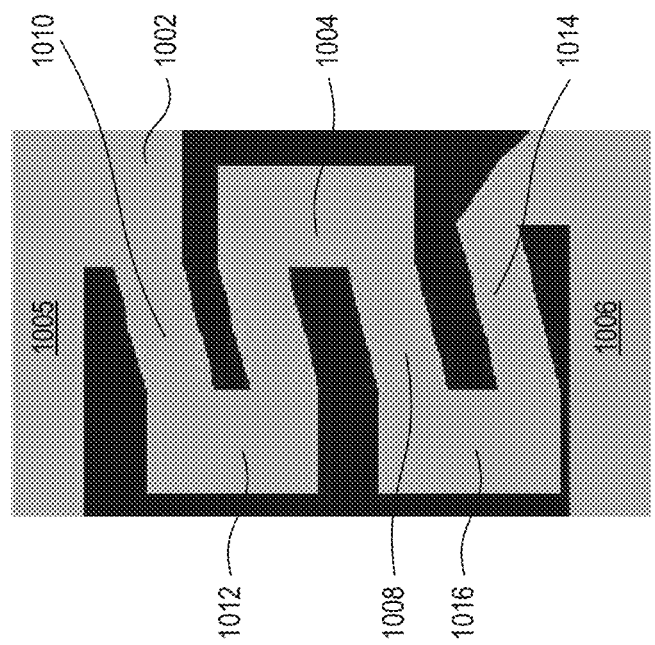
FIG. 10 illustrates a four bend flexure bearing, according to an example.

FIG. 10 illustrates a four bend flexure bearing, according to an example. In an example, the flexure 1002 can include more than one bend. In an example, this can allow for more tightly controlled out-of-plane motion. In an example, a number of switchbacks 1004 are included. In an example, the switchbacks define a zigzag that extends from the anchor 1006 to the proof-mass 1005. In an example, the zigzag includes switchbacks of a regular amplitude along the patter extending from the anchor 1006 to the proof-mass 1005. In additional embodiments, the amplitude varies. In an example, the switchbacks have a C-shape, with top 1008 and bottom 1014 members parallel to one another, but not parallel to a high-stiffness portion 1016.

Figure 11:
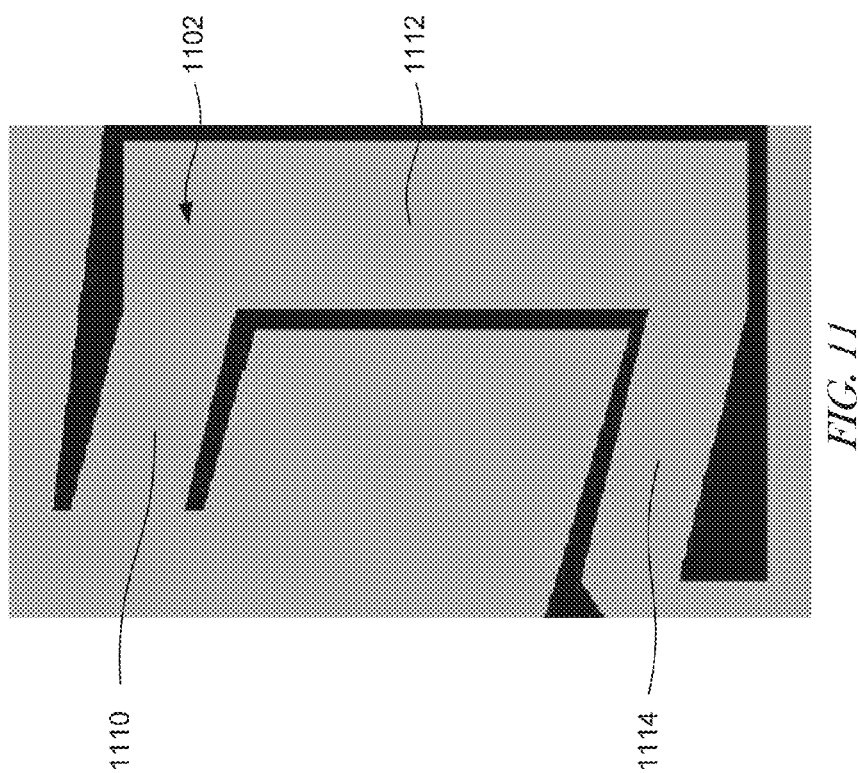
FIG. 11 illustrates a flexure bearing including a flexing flexure bearing and a non-flexing flexure bearing, according to an example.

FIG. 11 illustrates a flexure bearing including a flexing flexure bearing and a non-flexing flexure bearing, according to an example. In an example, a flexure 1102 can also be parameterized by lengthening or shortening the flexing flexure bearings 1110, 1114 or the non-flexing flexure bearing(s) 1112. In the example shown in FIG. 12, the outer flexing flexure bearing 1110 and non-flexing flexure bearing 1112 have been shortened.

Figure 12:
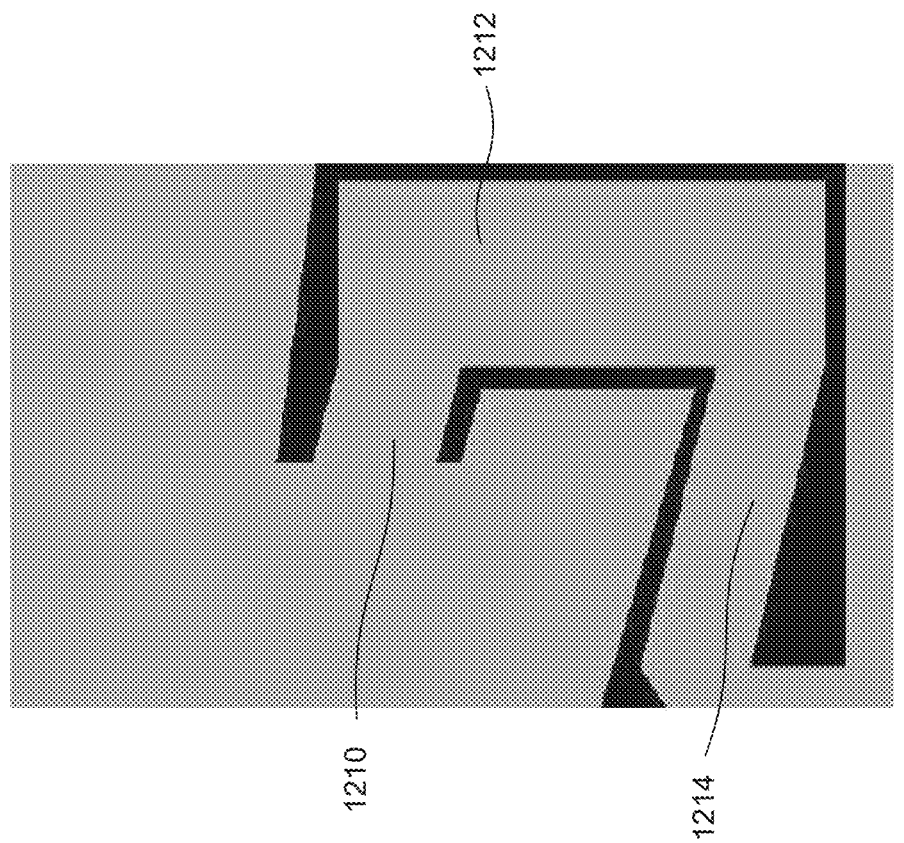
FIG. 12 illustrates a flexure bearing including a flexing flexure bearing shorter than the flexure bearing of FIG. 11, and a non-flexing flexure bearing shorter than the non-flexing flexure bearing of FIG. 11, according to an example.

FIG. 12 illustrates a flexure bearing including a flexing flexure bearing shorter than the flexure bearing of FIG. 11, and a non-flexing flexure bearing shorter than the non-flexing flexure bearing of FIG. 11, according to an example. The outer flexing flexure bearing 1210 and non-flexing flexure bearing 1212 have been shortened compared to the components of FIG. 11.

Figure 13B:
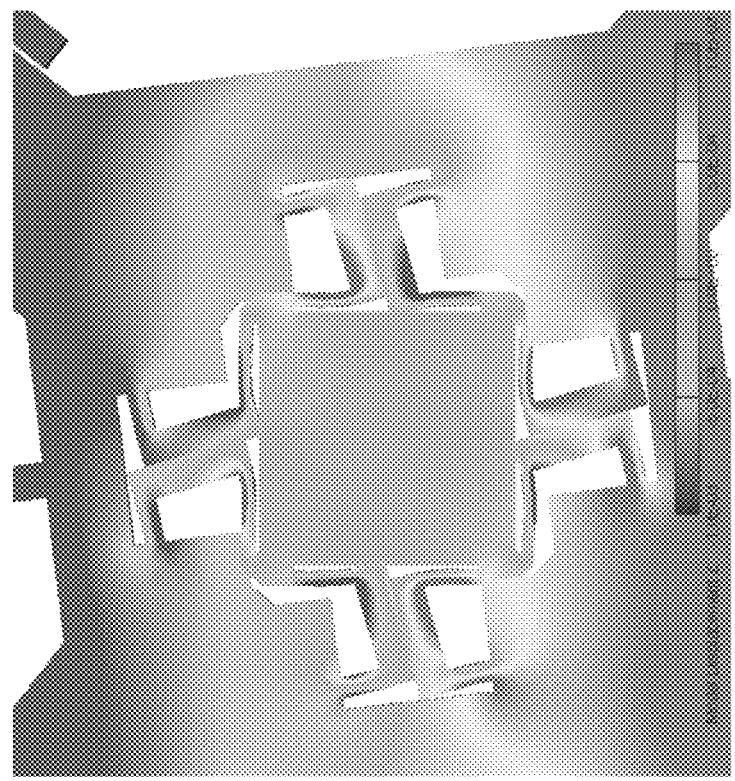
FIG. 13B illustrates stresses related to flexing of flexures bearings.
Figure 13A:
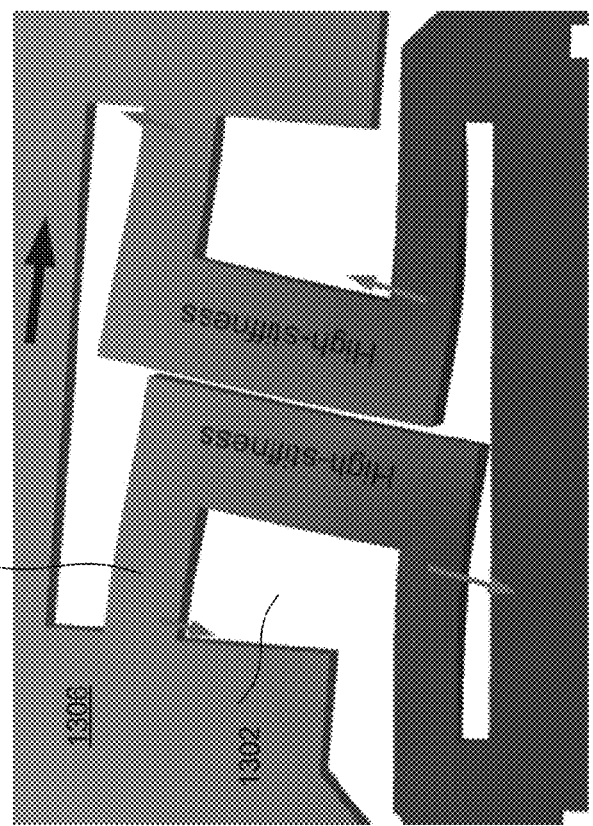
FIG. 13A illustrates a suspension with large clearances, according to an example.

FIG. 13A illustrates a suspension with large clearances, according to an example. FIG. 13B illustrates stresses related to flexing of flexures bearings. In the examples, there are voids 1302 disposed between the flexure bearing 1304 and the proof-mass 1306.

FIGS. 14A-D illustrate a die 1400 including various features, according to an example. The features can be used alone, or in combination. One feature is a switchback 1402. The switchback 1402 extends between nonlinear suspension member, e.g., a C-shaped flexure bearing 1406, and the proof-mass 1408. The addition of the switchback 1402 can further reduce quadrature error, at least because it reduces out-of-plane flexing due at least in part to DRIE etching, such as by offsetting bending of one bearing with bending of another bearing across a plane, such as plane 1422. Out-of-plane bending can be offset by bending a second flexure bearing 1407, which can be disposed across plane 1423.

Such offsetting is illustrated in FIG. 15. In FIG. 15, a first bearing 1502 bends away from the proof-mass 1508, while a bearing disposed across a horizontal reference plane 1510 bends toward the proof-mass. A bearing 1506 across the vertical reference plane 1512 and across the horizontal reference plane 1510 also bends away from the proof-mass 1508, in substantially the same way as the 1506, which can offset quadrature error by restoring balance to the flexure bearing suspension.

Returning to FIG. 14A and the description of the switchback 1402, the nonlinear suspension member 1406, e.g., a C-shaped flexure bearing, includes a first or inner portion 1410, a second or center portion 1420, and a third or outer portion 1412. In an example, the outer portion 1412 has a proximal portion coupled to the center portion 1420. In an example, a distal portion of the outer portion 1412 extends away from the anchor bisecting plane 1422. In an example, the outer portion 1412 is coupled with a fourth portion 1402, e.g., part of a switchback, of the first nonlinear suspension member 1406. In an example, the fourth portion 1402 is coupled to the distal portion of the outer portion 1412 at a proximal portion of the fourth portion 1402. In an example, the fourth portion 1402 extends from its proximal portion toward the anchor 1404 to its distal portion. In an example, the distal portion of the fourth portion 1402 is coupled to a fifth portion 1424 of the first nonlinear suspension member 1406. In an example, the fifth portion 1424 extends toward the anchor bisecting plane 1422. In an example, the inner portion 1410 and the outer portion 1412 are linear and parallel. Overall, switchback 1402 examples provide for additional flexing, and offsetting of that flexing, versus suspensions without a switchback 1402.

Figure 16B:
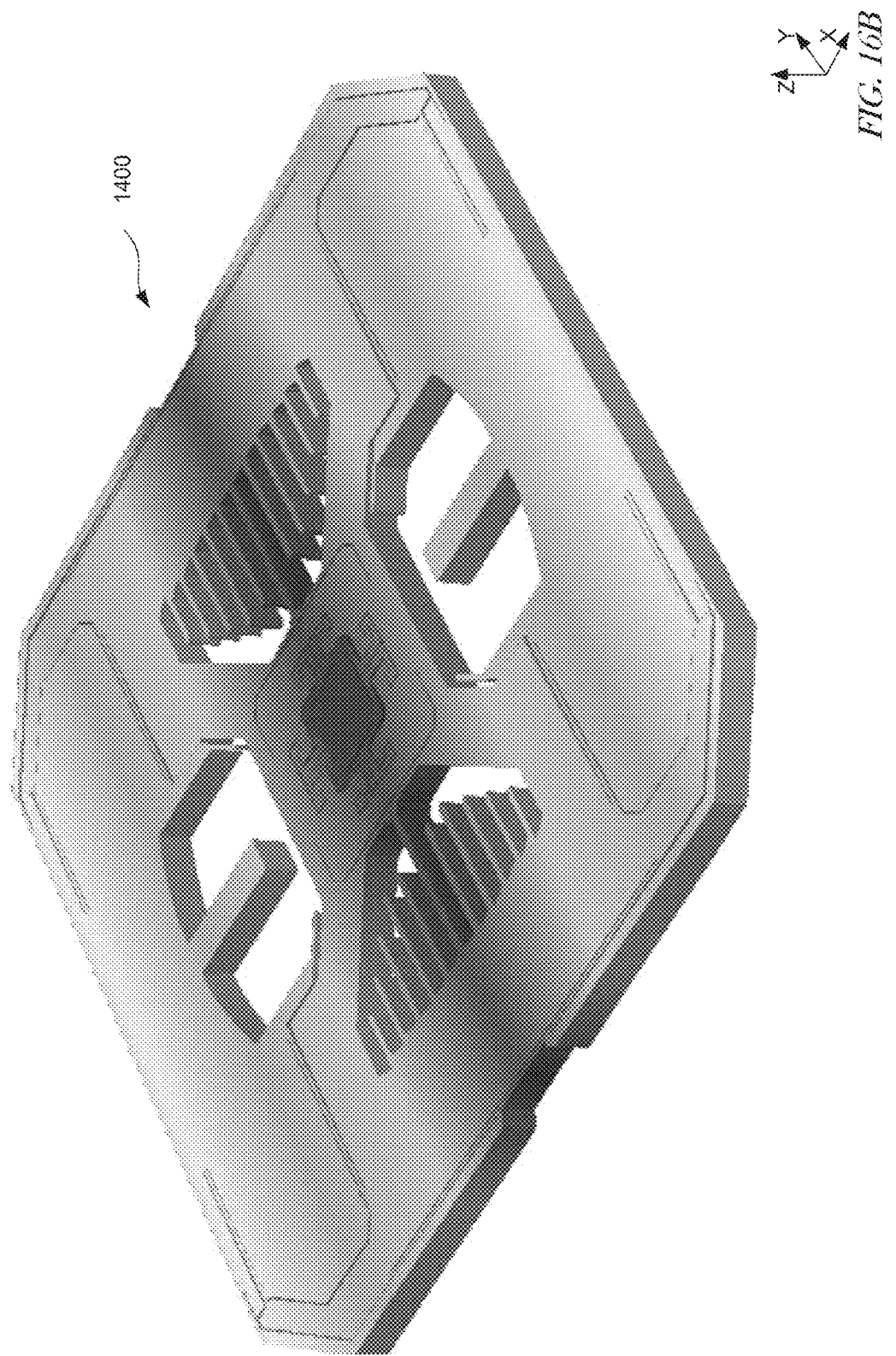
FIG. 16B illustrates the suspension of FIG. 14 flexed about a Y-axis, according to an example.
Figure 16C:
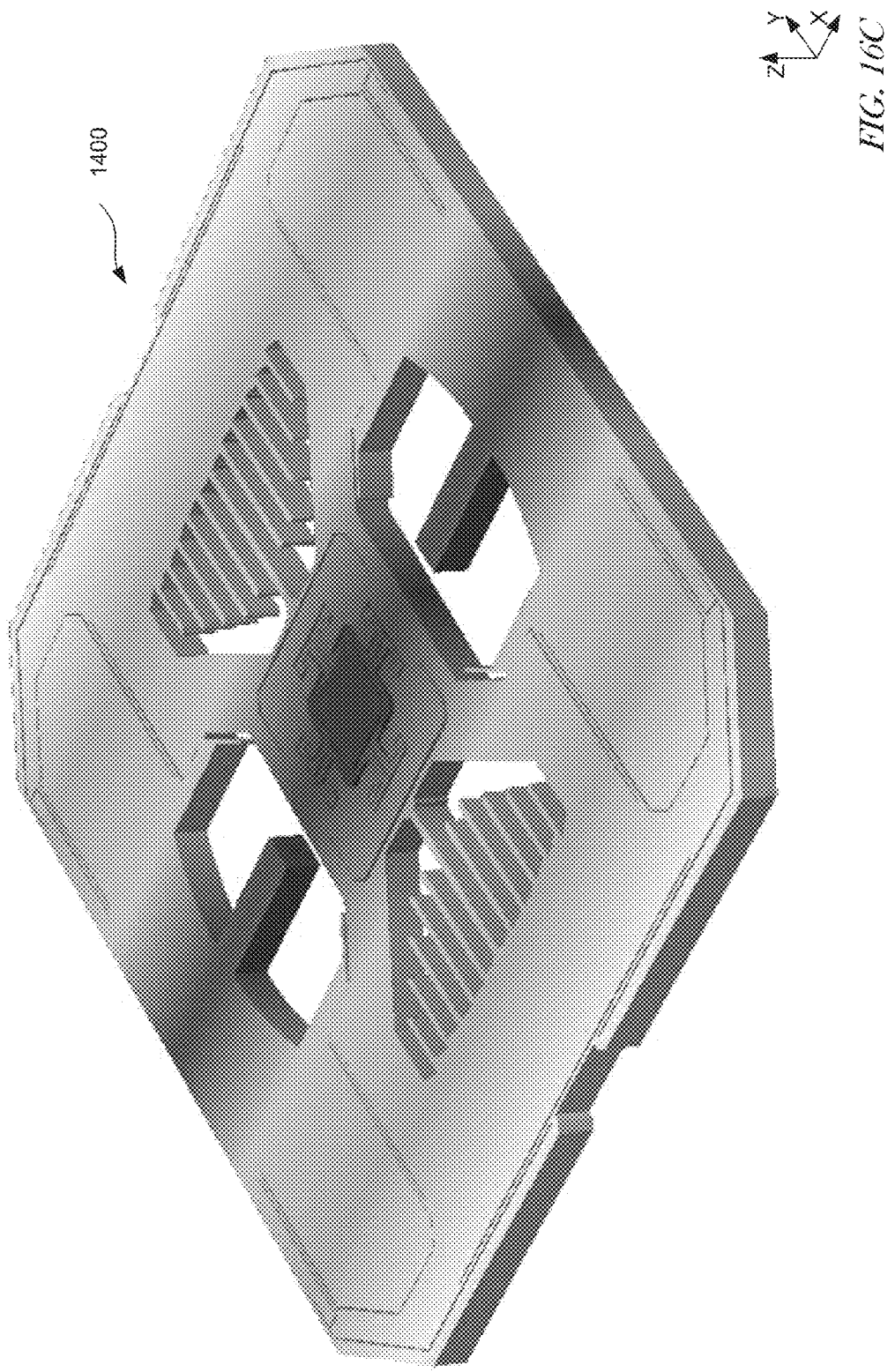
FIG. 16C illustrates the suspension of FIG. 14 flexed about the X-axis, according to an example.
Figure 16D:
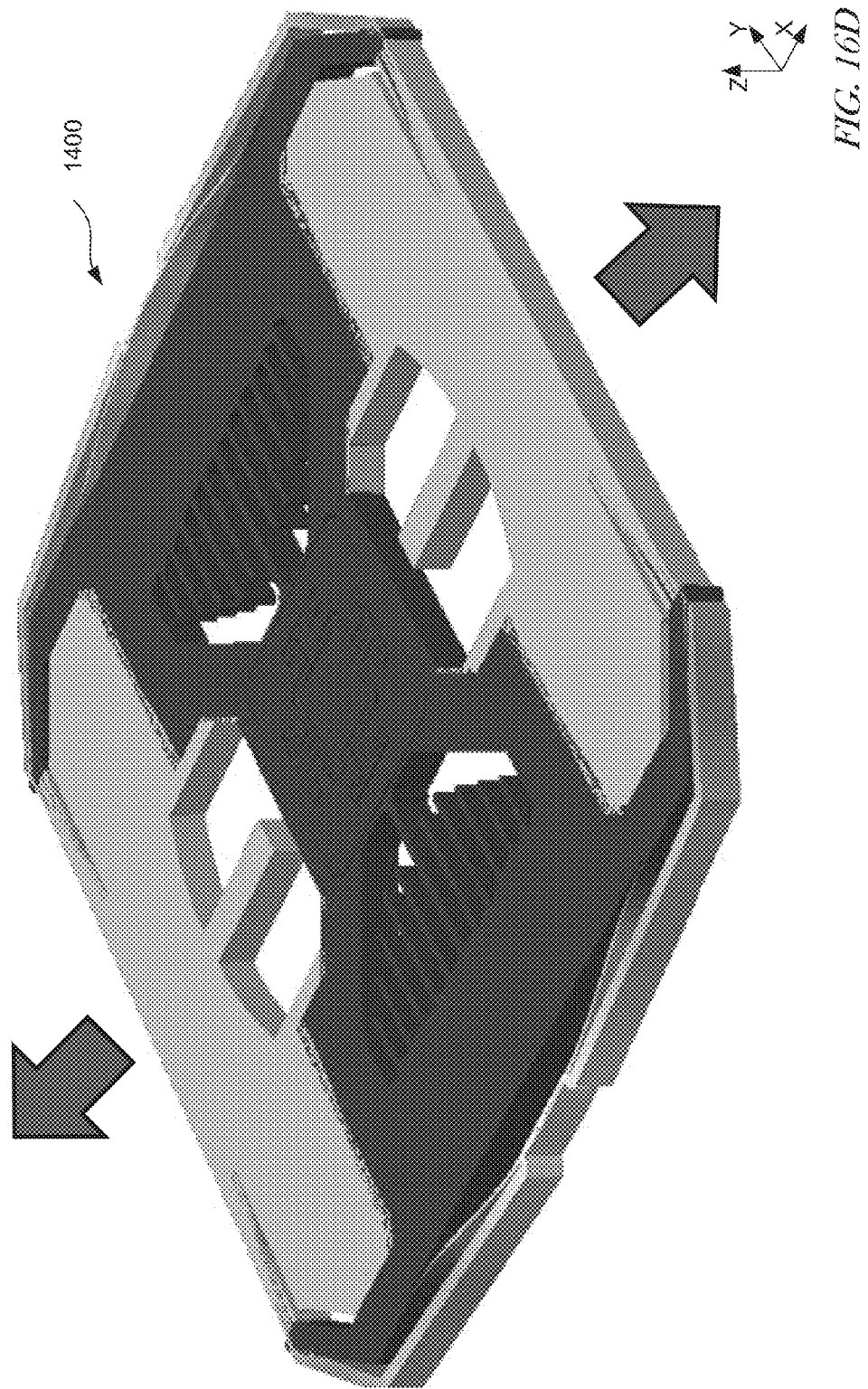
FIG. 16D illustrates the suspension of FIG. 14 flexed in displacement along a Y-axis, according to an example.

A second feature is nonsymmetrical stator finger electrodes, as illustrated specifically in FIGS. 14C-D. The electrode structures partially illustrated in FIGS. 14C and 14D are configured for use in a MEMS multi-axis gyroscope with an anti-phase linear Z-axis rotation sense mode. In some examples, the two proof-masses 1454 and 1456 can move in opposite directions. An example of such motion is illustrated in FIG. 16D. Stators 1430, 1431 are anchored by respective side anchors 1428, 1429, in an example. In various examples, electrodes on opposite sides of the central anchor 1404 should be sensitive to concurrent outward or inward motion of the proof-masses to achieve differential pickup of that motion. Thus, stator electrodes that are symmetrical about the Y-Z axis should not be used, as this design would not sense differential motion, as differential motion sensing relies on providing a capacitance differential between two sides of the device, and if the stator electrodes are symmetrical, the capacitance would change similarly on both sides of the Y-Z axis.

The illustrated Z-axis rotation sensing electrode structure senses differential motion. The structure provides for differential detection of anti-phase sense motion, with proof-mass fingers that are symmetric about the Y-Z plane 1422, while stator electrodes that are not symmetric about the Y-Z plane. Symmetrical electrode configurations are desirable for vibration rejection. The disclosed electrodes provide proof-mass electrodes that are symmetrical across the Y-Z plane. The symmetrical proof-mass electrodes achieve improved vibration rejection versus nonsymmetrical designs.

The sectional views in FIGS. 14C-D illustrate interdigitation details on opposing sides of a die, according to an example. Although the electrodes are "pixilated" in appearance, smooth, continuous electrodes are contemplated, as are those demonstrating the features of DRIE. In FIG. 14C, the left stator 1430 has stator fingers 1450 outside (e.g., further away from a central anchor 1404) the proof-mass 1446 fingers 1452, while the right stator 1430' illustrated in FIG. 14D has stator fingers 1452' inside the proof-mass 1446' figures 1452'. Notice that the small capacitive gaps are on the left side of the stator fingers in both electrodes of FIGS. 14C and 14D, and that the proof-mass fingers are fully symmetrical. When proof-mass 1454 of FIG. 14C moves to the left, capacitance of the electrodes in that figure increases. When the proof-mass 1456 of FIG. 14D moves to the right, capacitance of electrode in that illustrate decreases. Thus, differential capacitance is produced, which can be detected.

In an example, Z-axis gyro sense motion is sensed via differential proof-mass sensing, while in-phase motion, i.e. motion of the proof-masses in the same direction, is rejected. In various examples, drive motion (1448 in FIG. 14B) is torsional about the Z-axis (see FIG. 15 and FIG. 16A). Z-axis gyro sense motion is based on proof-masses 1454 and 1456 that oscillate in opposite directions. FIG. 16D illustrates such motion. The Z-axis sense motion is linear in-plane (e.g., the X-Y plane) and anti-phase (e.g., proof-masses 1454 and 1456 oscillate in opposite directions).

Figure 14A:
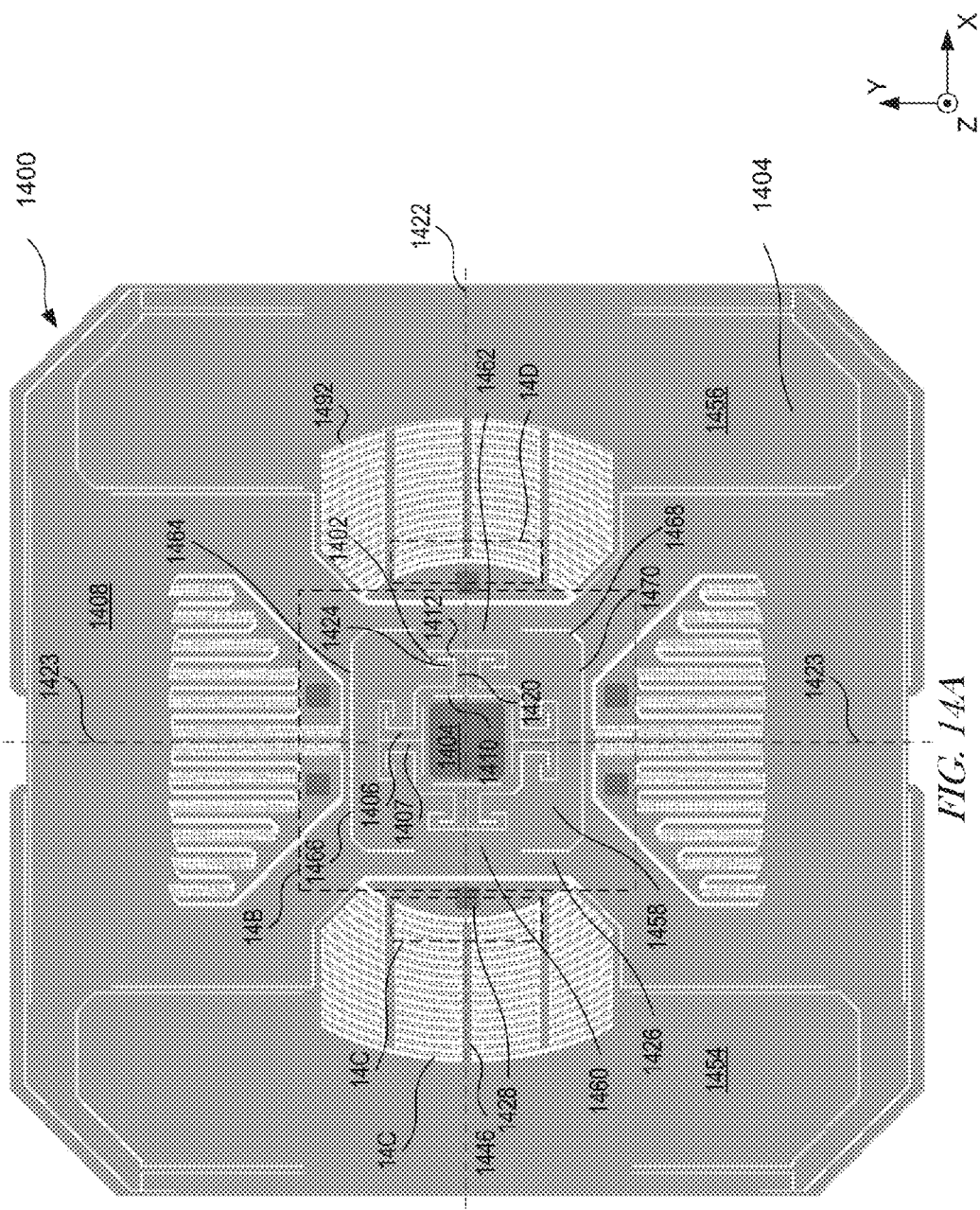
FIG. 14A illustrates a suspension including a switchback, according to an example.
Figure 14B:
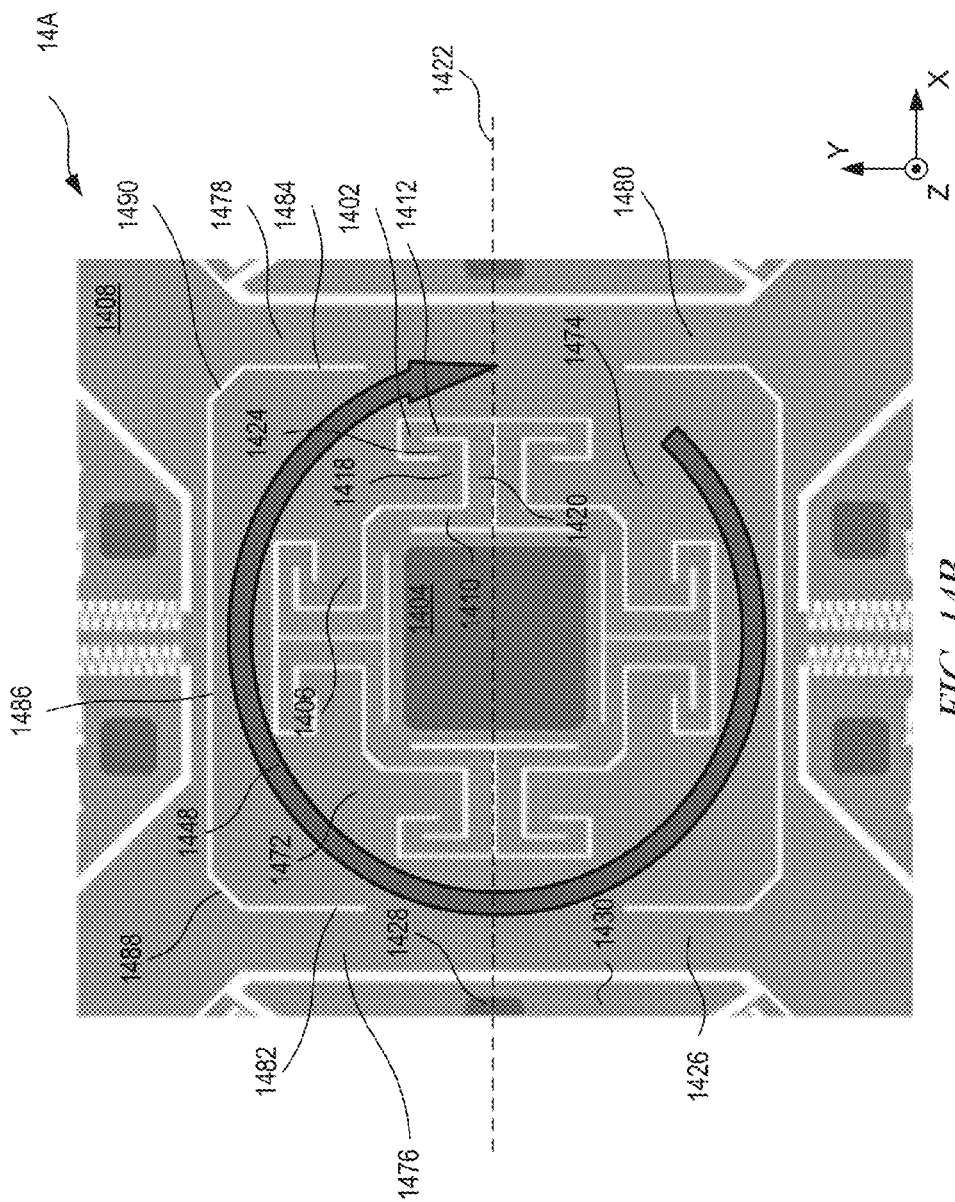
FIG. 14B illustrates a sectional taken at 14B of FIG. 14A.

A third feature includes vertical flexures 1426, illustrated in FIGS. 14A and 14B. In an example, the vertical flexures 1426 allow the proof-mass frame to deflect more than other portions of the die, such as the inner gimbal 1458, and are useful for adjusting the Y-axis sense resonant frequency. The illustrated gimbal structure provides a flexure 1426 that deflects only for the Y-axis sense mode of the gyroscope, in which the proof-mass 1408 rotates around the X-axis, as illustrated in FIG. 16C. Thus, it allows a designer to adjust the Y-axis sense resonant frequency independent from the drive and X-axis sense frequencies. This enables improvement of the central suspensions to minimize quadrature error in X and Y axes simultaneously.

For example, a fixed portion or substrate can be coupled to an anchor 1404. A fixed portion includes a package substrate, for examples. A first nonlinear suspension member 1406 can be coupled to anchor 1404 on a side of the anchor 1404. A second nonlinear suspension member 1407 coupled to the anchor 1404 on the same side of the anchor 1404. The second nonlinear suspension member can have a shape and location mirroring the first nonlinear suspension member about an anchor 1404 bisecting plane, although the present subject matter is not so limited. One or both of the first nonlinear suspension member and the second nonlinear suspension member can form part of an inner gimbal 1458 of the microelectromechanical die 1400.

A proof-mass 1408 that is planar can be coupled to the inner gimbal 1458. The proof-mass can be suspended by a first suspension 1460 member disposed on a first side of the anchor 1404. The proof-mass can be suspended by a second suspension member 1462 disposed on a second side of the anchor 1404. The first suspension member 1460 can be coupled opposite the first side of the anchor.

The die 1400 can define a first gap 1464. The gap 1464 can extend along a first side 1466 of the anchor 1404. A second gap 1468 can extend along a second side 1470 of the anchor 1404. The second gap 1468 can be opposite the first side 1466. Each of the first gap 1464 and the second gap 1468 can extend between the inner gimbal 1458 and the proof-mass 1408.

The first gap 1464 can extend from the first suspension member 1460 to the second suspension member 1462. The second gap 1468 can extend from the first suspension member 1460 to the second suspension member 1462. One or both of the first gap and the second gap can be C-shaped. The first C-shape can define a first opening 1472 that opens to a second opening 1474 of the second C-shape of the second gap 1468.

The first C-shape can include a first end portion 1482 and a second end portion 1484, with a center portion 1486 extending between the first end portion and the second end portion. The first end portion and the second end portion can be perpendicular to the center portion. A first canted portion 1488 can extend between the first end portion 1482 and the center portion and a second canted portion 1490 can extend between the second end portion 1484 and the center portion. The first gap can be a mirrored shape of the second gap and the first gap can be mirrored along the anchor bisecting plane.

The first gap can define a first vertical flexure 1476 and a second vertical flexure 1478. The second gap can define a third vertical flexure 1426 and a fourth vertical flexure 1480. Each of the first, second, third and fourth vertical flexures can be elongate, with a length longer than a width. Each respective length can extend away from a respective suspension member. Each respective length can extend away from the anchor bisecting plane 1422.

In an example, a solid proof-mass frame structure, such as the structure illustrated in FIG. 7, depends on the central suspension system to set the drive and X/Y sense frequencies. Thus, all three frequencies and quadrature error in two axes may be improved simultaneously.

The gimbal structure illustrated in FIGS. 14A-D provides an extra degree of freedom to adjust the Y-axis sense mode. In an example, central flexures 1426 extend away from an inner gimbal 1458 along the Y-axis. These flexures can flex vertically. FIG. 16C illustrates flex of the flexures to enable the proof-mass to rotate around the X-axis. In an example, one or more flexures 1426 can connect the inner gimbal 1458 to the proof-mass 1408 frame. In an example, these flexures 1426 deflect only for the Y-axis sense mode of the gyroscope. The added out-of-plane flexures allow for adjustment of the Y-axis sense resonant frequency independent from the drive and X-axis sense frequencies.

In various examples, drive motion (1448 in FIG. 14B) is torsional about the Z-axis, such as about the central anchor 1404. FIG. 15 illustrates the suspension of FIG. 14 flexed in torsion around a Z-axis, according to an example and FIG. 16A also illustrates the suspension of FIG. 14 flexed in torsion around a Z-axis, according to an example. FIG. 16B illustrates the suspension of FIG. 14 flexed about a Y-axis, according to an example. In these examples, the flexures 1426 demonstrate limited flex. FIG. 16C, however, illustrates the suspension of FIG. 14 flexed about the X-axis, flexing flexures 1426, according to an example. In an example, the Y-axis sense motion is out-of-plane torsional about the X-axis.

An additional feature of FIGS. 14A-D includes curved finger electrodes. These can be insensitive to rotational drive motion. Various examples can include electrodes that are curved around an axis orthogonal to the plane in which the electrodes are disposed. Curved finger electrodes, e.g. fingers 1450 and 1452, can be less sensitive to the rotational drive motion such as the motion illustrated in FIG. 16A. In an example, while proof-mass electrodes are rotating with respect to stator electrodes, gap distance between the electrodes remains the similar or the same. This can preserve a similar capacitance, in some examples. However, in some examples, the area of one electrode facing the other changes, which can provide a differential capacitance, allowing for sensing or rotation around the Z-axis. Thus, providing curved electrodes to maintain a gap distance between proof-mass electrodes and stator electrodes as the die rotates about an axis orthogonal to a plane in which the electrodes are exposed can optionally provide a no or low capacitance change, or a desired capacitance change that can be sensed to detect the rotation.

A microelectromechanical die 1400 can couple with a substrate such as a package to form a packaged integrated circuit. A proof-mass 1408 can be coupled to the substrate at an anchor 1404. The proof-mass can include a first portion 1454 that can be moveable with respect to the anchor 1404. The first portion can include a first proof-mass electrode 1452. A second portion 1456 of the proof-mass 1408, opposite the first portion 1454 with respect to the anchor 1404, can be moveable with respect to the anchor 1404 and the first portion 1454. The second portion 1456 can include a second proof-mass electrode 1452'. The proof-mass 1408 can define a first opening 1492 on a first side of the anchor 1404, such as on the first side of the plane 1423. The first portion 1454 of the proof-mass can be moveably coupled in the opening 1492 to the substrate.

The first proof-mass electrode 1452 can be one of a first plurality of proof-mass electrodes extending into the opening 1492. The plurality can be spaced apart from one another. The proof-mass 1408 can define a second opening 1494 on the second side of the anchor, such as on the first side of the plane 1423. The second portion 1456 can be coupled inside the second opening 1494. The second proof-mass electrode 1452' can be one of a second plurality of proof-mass electrodes extending into the opening 1494, spaced apart from one another.

A first stator 1430 can be coupled to the substrate, such as via anchor 1428, and can include a first stator electrode 1450. The first stator electrode 1450 can extend alongside the first proof-mass electrode 1452 of the proof-mass to form a first electrode pair. A second stator 1431 can be coupled to the substrate and can include a second stator electrode 1451, opposite the first stator electrode 1450. The second stator electrode 1451 can extend alongside the second proof-mass electrode 1452' of the second portion 1456 of the proof-mass 1408 to form a second electrode pair. The first electrode pair can form a first capacitor. The second electrode pair can form a second capacitor.

The first proof-mass electrode of the proof-mass can be opposite the second proof-mass electrode of the proof-mass, across the anchor and wherein the first stator electrode can be coupled to the substrate opposite the second anchored electrode, across the anchor.

The first stator electrode 1450 can be one of a first plurality of stator electrodes interdigitated and paired with respective ones of the first plurality of proof-mass electrodes to form the first electrode pair. The second stator can be one of a second plurality of stator electrodes interdigitated and paired with respective ones of the second plurality of stator electrodes to form the second electrode pair In a first vibratory mode of the die 1400 the first portion 1454 of the proof-mass can be to move away from the second portion 1456 of the proof-mass. The first stator electrode 1450 and second stator electrode 1451 can be arranged such that a distance between electrodes of the first electrode pair can be inversely proportional to a distance between electrodes of the second electrode pair. The first portion 1454 of the proof-mass can be symmetrical, across the anchor 1404, with the second portion 1456 of the proof-mass. The first stator 1430 can be asymmetrical, across the anchor 1404, with respect to the second stator 1431.

Figure 18:
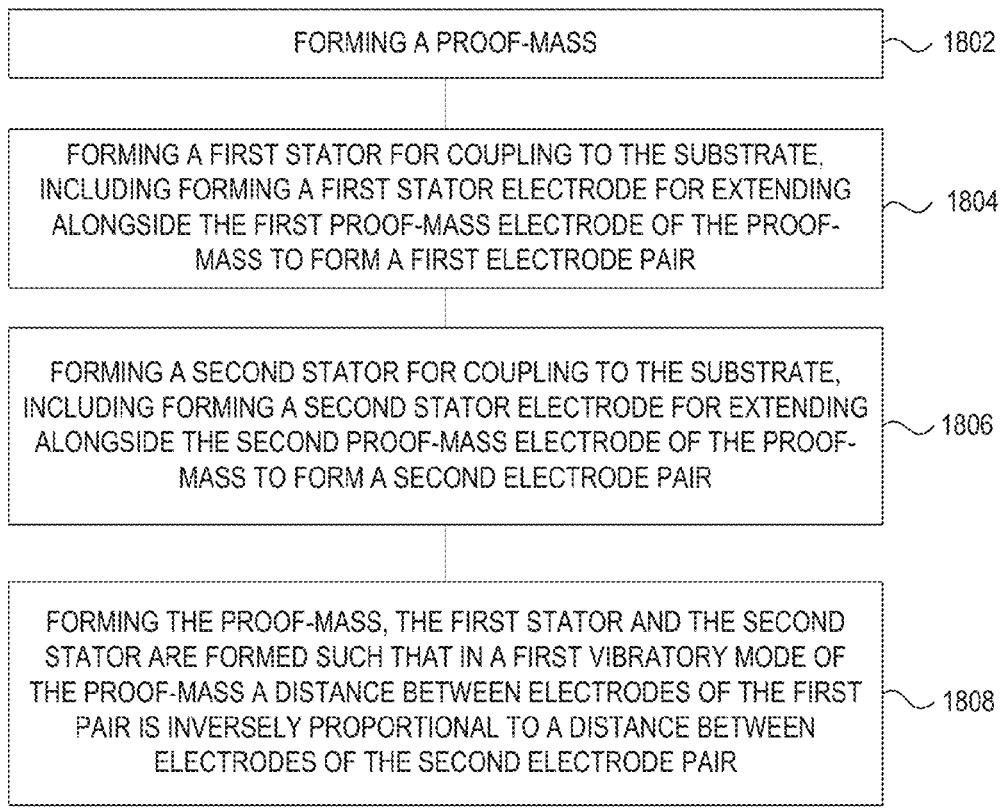
FIG. 18 shows a method of making vibration rejection z-axis electrodes, according to an embodiment.

FIG. 18 shows a method of making vibration rejection z-axis electrodes, according to an embodiment. At 1802, an example includes forming a proof-mass. The example can include forming an anchor for coupling the proof-mass to a substrate. The example can include forming a first portion on a first side of the anchor, the first portion moveable with respect to the anchor and including a first proof-mass electrode. The example can include forming a second portion on a second side of the anchor, opposite the first side, the second portion including a second proof-mass electrode. At 1804, the example can include forming a first stator for coupling to the substrate, including forming a first stator electrode for extending alongside the first proof-mass electrode of the proof-mass to form a first electrode pair. At 1806, the example can include forming a second stator for coupling to the substrate, including forming a second stator electrode for extending alongside the second proof-mass electrode of the proof-mass to form a second electrode pair. According to the example at 1808, the proof-mass, the first stator and the second stator are formed such that in a first vibratory mode of the proof-mass a distance between electrodes of the first pair is inversely proportional to a distance between electrodes of the second electrode pair.

In the first vibratory mode the first plurality of stator electrodes can be configured to move away from the first plurality of stator electrodes and away from the anchor while the second plurality of stator electrodes can be configured to move toward the second plurality of stator electrodes and toward the anchor. The proof-mass can be configured to vibrate with respect to the substrate to vary the distances between the first plurality of stator electrodes and the first plurality of stator electrodes and to vary the distances between the second plurality of stator electrodes and the second plurality of stator electrodes.

One of the first plurality of stator electrodes, closest to the anchor, e.g., 1452, being a distance from one of the first plurality of stator electrodes, e.g. 1450, closest to the anchor, when one of the second plurality of stator electrodes, e.g. 1451, closest to the anchor, can be a greater distance from one of the second plurality of stator electrodes, e.g. 1452', closest to the anchor.

Each of the first proof-mass electrode 1452 and the first stator electrode 1450 can be elongate. A distance D14 between the first proof-mass electrode and the first stator electrode can be substantially constant along the length L14 of each. Each of the second proof-mass electrode 1452' and the second stator electrode 1451 can be elongate. A distance between the second proof-mass electrode and the second stator electrode being substantially constant along the length of each.

One or more of the first proof-mass electrode, the second proof-mass electrode, the first stator electrode and the second stator electrode can be curved. Each of the electrodes can be curved around an axis around which the proof-mass can be configured to rotate in a second vibratory mode. The axis can be the intersection between the plane 1422 and the plane 1423. The proof-mass can be formed into shape through material removal from a wafer, such as by excising material, such as through etching. Forming can include deep reactive-ion etching.

The die 1400 can be used to sense motion. Vibration of the first portion of a proof-mass and the second portion of a proof-mass can be excited so that the first portion and the second portion move together and apart in synchrony, toward a respective first stator and second stator. Motion of the die along a direction extending between the first portion of the proof-mass and the second portion of the proof-mass can be sensed by measuring a differential in respective capacitance values for the first stator and the second stator. The first proof-mass electrode 1452 can move toward a first stator electrode 1450 of a first stator 1430 while the second portion 1456 can include a second proof-mass electrode 1452' that moves away from a second stator electrode 1451 of a second stator. Sensing motion can include sensing a differential between a first capacitance of a first electrode pair including the first proof-mass electrode and the first stator electrode and a second electrode pair including the second proof-mass electrode and the second stator electrode. The proof-mass can be rotated in the plane of the proof-mass, e.g. a plane parallel planes 1422 and 1423, without changing the measured differential in respective capacitance values for the first stator and the second stator. Rotation can occur without changing a distance between electrodes of the first electrode pair and without changing a distance between electrodes of the second electrode pair.

Figure 17:
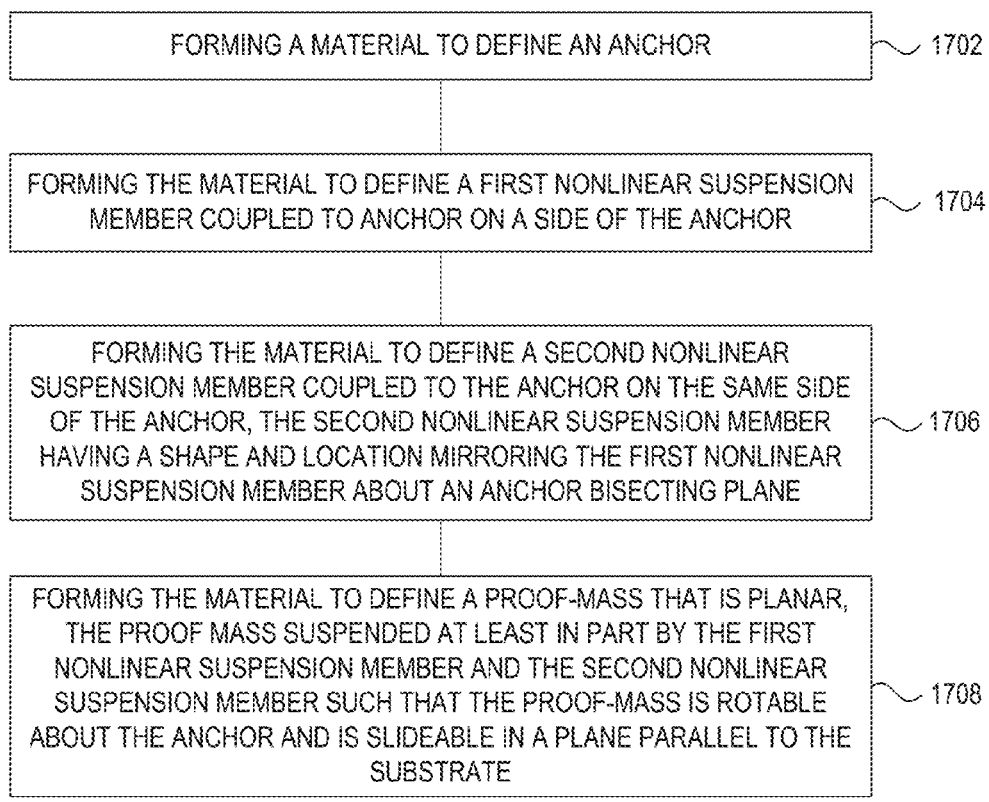
FIG. 17 shows a method of making a low-quadrature-error suspension, according to an embodiment.

FIG. 17 shows a method of making a low-quadrature-error suspension, according to an embodiment. At 1702 the method includes etching a material to define an anchor. At 1704, the method includes etching the material to define a first nonlinear suspension member coupled to anchor on a side of the anchor. At 1706, the method includes etching the material to define a second nonlinear suspension member coupled to the anchor on the same side of the anchor, the second nonlinear suspension member having a shape and location mirroring the first nonlinear suspension member about an anchor bisecting plane. At 1708 the method includes etching the material to define a proof-mass that is planar, the proof-mass suspended at least in part by the first nonlinear suspension member and the second nonlinear suspension member such that the proof-mass is rotable about the anchor and is slideable in a plane parallel to the substrate.

Optional methods are possible, including methods in which etching includes deep reactive-ion etching. In some optional methods, the first nonlinear suspension member and the second nonlinear suspension member are part of a first set, comprising etching the material to define a second set of nonlinear suspension members opposite the first set. Some optional methods include etching a third set of nonlinear suspension members for coupling the anchor to the proof-mass and etching a fourth set of nonlinear suspension members for coupling the anchor to the proof-mass, wherein the third set and the fourth set have a similar for factor to the first set and the second set and are bisected by a second anchor bisecting plane perpendicular the first.

Additional Notes

The subject matter of the present document can be described using several examples. Example 1 can include a microelectromechanical die for sensing motion, that includes a fixed portion, an anchor coupled to the fixed portion, a first nonlinear suspension member coupled to anchor on a side of the anchor, a second nonlinear suspension member coupled to the anchor on the same side of the anchor, the second nonlinear suspension member having a shape and location mirroring the first nonlinear suspension member about an anchor bisecting plane and a proof-mass that is planar, the proof-mass suspended at least in part by the first nonlinear suspension member and the second nonlinear suspension member such that the proof-mass is rotable about the anchor and is slideable in a plane parallel to the fixed portion.

Example 2 includes the subject matter of example 1, wherein the first nonlinear suspension member has a C-shape.

Example 3 includes the subject matter of example 2, wherein the C-shape includes a inner portion coupled to the anchor and extending toward the anchor bisecting plane, a center portion having a proximal portion and a distal portion, with a proximal portion coupled to the inner portion and a distal portion extending away from the anchor along the anchor bisecting plane and coupled to a outer portion extending away from the anchor bisecting plane.

Example 4 includes the subject matter of example 3, wherein the outer portion of the first nonlinear suspension member has a proximal portion coupled to the center portion of the first nonlinear suspension member, and a distal portion extending away from the anchor bisecting plane, with a fourth portion of the first nonlinear suspension member coupled to the distal portion of the outer portion at a proximal portion of the fourth portion, and extending toward the anchor to a distal portion of the fourth portion that is coupled to a fifth portion of the first nonlinear suspension member that extends toward the anchor bisecting plane.

Example 5 includes the subject matter of any of examples 3-4, wherein the inner portion and the outer portion are linear and parallel.

Example 6 includes the subject matter of example 5, wherein the center portion is perpendicular the inner portion and the outer portion.

Example 7 includes the subject matter of any of examples 3-6, wherein the center portion is parallel the anchor bisecting plane.

Example 8 includes the subject matter of any of examples 1-7, wherein the anchor, the first nonlinear suspension member, the second nonlinear suspension member and the proof-mass are formed of a monolithic material.

Example 9 includes the subject matter of example 8, wherein the fixed portion comprises a fixed monolithic material other than the monolithic material of the anchor, the first nonlinear suspension member, the second nonlinear suspension member and the proof-mass.

Example 10 includes the subject matter of any of examples 1-9, wherein the fixed portion comprises a fixed monolithic material the same as the monolithic material of the anchor, the first nonlinear suspension member, the second nonlinear suspension member and the proof-mass.

Example 11 includes the subject matter of any of examples 1-10, wherein the die is wafer shaped, with each of the first nonlinear suspension member and the second nonlinear suspension member have a substantially rectangular cross-section with the height of the cross-section smaller than the width.

Example 12 includes a that includes etching a material to define an anchor, etching the material to define a first nonlinear suspension member coupled to anchor on a side of the anchor, etching the material to define a second nonlinear suspension member coupled to the anchor on the same side of the anchor, the second nonlinear suspension member having a shape and location mirroring the first nonlinear suspension member about an anchor bisecting plane and etching the material to define a proof-mass that is planar, the proof-mass suspended at least in part by the first nonlinear suspension member and the second nonlinear suspension member such that the proof-mass is rotable about the anchor and is slideable in a plane parallel to the substrate.

Example 13 includes the subject matter of example 12, wherein etching includes deep reactive-ion etching.

Example 14 includes the subject matter of any of examples 12-13, wherein the first nonlinear suspension member and the second nonlinear suspension member are part of a first set, comprising etching the material to define a second set of nonlinear suspension members opposite the first set.

Example 15 includes the subject matter of example 14, comprising etching a third set of nonlinear suspension members for coupling the anchor to the proof-mass and etching a fourth set of nonlinear suspension members for coupling the anchor to the proof-mass, wherein the third set and the fourth set have a similar for factor to the first set and the second set and are bisected by a second anchor bisecting plane perpendicular the first.

Example 16 can include any of the preceding examples, wherein a microelectromechanical die senses motion. The example can include a substrate. The example can include a proof-mass coupled to the substrate at an anchor. The proof-mass can include a first portion moveable with respect to the anchor, the first portion including a first proof-mass electrode. The example can include a second portion of the proof-mass, opposite the first portion with respect to the anchor, the second portion moveable with respect to the anchor and the first portion, the second portion including a second proof-mass electrode. The example can include a first stator coupled to the substrate and including a first stator electrode extending alongside the first proof-mass electrode of the first portion of the proof-mass to form a first electrode pair. The example can include a second stator coupled to the substrate and including a second stator electrode, opposite the first stator electrode, and extending alongside the second proof-mass electrode of the second portion of the proof-mass to form a second electrode pair. According to the examples, in a first vibratory mode, in which the first portion of the proof-mass is to move away from the second portion of the proof-mass, the proof-mass, first stator electrode and second stator electrode are arranged such that a distance between electrodes of the first electrode pair is inversely proportional to a distance between electrodes of the second electrode pair.

Example 17 can include any of the preceding examples wherein the first proof-mass electrode of the proof-mass is opposite the second proof-mass electrode of the proof-mass, across the anchor and wherein the first stator electrode is coupled to the substrate opposite the second anchored electrode, across the anchor.

Example 18 can include any of the preceding examples wherein the first portion of the proof-mass is symmetrical, across the anchor, with the second portion of the proof-mass, and the first stator is asymmetrical, across the anchor, with respect to the second stator.

Example 19 can include any of the preceding examples wherein the first electrode pair comprises a first capacitor, and the second electrode pair comprises a second capacitor.

Example 20 can include any of the preceding examples wherein each of the first proof-mass electrode and the first stator electrode are elongate, with a distance between the first proof-mass electrode and the first stator electrode being substantially constant along the length of each Example 21 can include any of the preceding examples wherein each of the second proof-mass electrode and the second stator electrode are elongate, with a distance between the second proof-mass electrode and the second stator electrode being substantially constant along the length of each.

Example 22 can include any of the preceding examples wherein the proof-mass defines a first opening on a first side of the anchor, with the first portion of the proof-mass moveably coupled therein, with a first plurality of proof-mass electrodes, including the first proof-mass electrode, extending into the opening, spaced apart from one another. In the example the proof-mass can define a second opening on the second side of the anchor, with the second portion coupled therein, with a second plurality of proof-mass electrodes, including the second proof-mass electrode, extending into the opening, spaced apart from one another.

Example 23 can include any of the preceding examples wherein the first stator electrode is one of a first plurality of stator electrodes interdigitated and paired with respective ones of the first plurality of proof-mass electrodes to form the first electrode pair; and wherein the second stator electrode is one of a second plurality of stator electrodes interdigitated and paired with respective ones of the second plurality of stator electrodes to form the second electrode pair.

Example 24 can include any of the preceding examples wherein, in the first vibratory mode, the first plurality of stator electrodes is configured to move away from the first plurality of stator electrodes and away from the anchor while the second plurality of stator electrodes is configured to move toward the second plurality of stator electrodes and toward the anchor.

Example 25 can include any of the preceding examples wherein the proof-mass is configured to vibrate with respect to the substrate to vary the distances between the first plurality of stator electrodes and the first plurality of stator electrodes and to vary the distances between the second plurality of stator electrodes and the second plurality of stator electrodes, with one of the first plurality of stator electrodes, closest to the anchor, being a distance from one of the first plurality of stator electrodes, closest to the anchor, when one of the second plurality of stator electrodes, closest to the anchor, is a greater distance from one of the second plurality of stator electrodes, closest to the anchor.

Example 26 can include any of the preceding examples wherein the first proof-mass electrode, the second proof-mass electrode, the first stator electrode and the second stator electrode are curved, wherein each of the electrodes curves around an axis around which the proof-mass is configured to rotate in a second vibratory mode.

Example 27 can include any of the preceding examples and can include forming a proof-mass, including forming an anchor for coupling the proof-mass to a substrate. The example can include forming a first portion on a first side of the anchor, the first portion moveable with respect to the anchor and including a first proof-mass electrode. The example can include forming a second portion on a second side of the anchor, opposite the first side, the second portion including a second proof-mass electrode. The example can include forming a first stator for coupling to the substrate, including forming a first stator electrode for extending alongside the first proof-mass electrode of the proof-mass to form a first electrode pair. The example can include forming a second stator for coupling to the substrate, including forming a second stator electrode for extending alongside the second proof-mass electrode of the proof-mass to form a second electrode pair. According to the example, the proof-mass, the first stator and the second stator are formed such that in a first vibratory mode of the proof-mass a distance between electrodes of the first pair is inversely proportional to a distance between electrodes of the second electrode pair.

Example 28 can include any of the preceding examples wherein forming includes deep reactive-ion etching.

Example 29 can include any of the preceding examples wherein forming the first proof-mass electrode, forming the second proof-mass electrode, forming the first stator electrode and forming the second stator electrode includes forming each with a curvature, with each curving around an axis around which the proof-mass rotates in a second vibratory mode.

Example 30 can include any of the preceding examples comprising forming a first capacitor with the first electrode pair and forming a second capacitor with the second electrode pair.

Example 31 can include any of the preceding examples wherein forming the first proof-mass electrode and the first stator electrode includes forming a first distance between them that is substantially constant along a length of the first electrode pair, and forming the second proof-mass electrode and the second stator electrode includes forming a second distance between them that is substantially constant along a length of the second electrode pair.

Example 32 can include any of the preceding examples, including a method for sensing motion with a microelectromechanical die, comprising. The example can include exciting vibration of a first portion of a proof-mass and a second portion of a proof-mass so the first portion and the second portion move together and apart in synchrony, toward a respective first stator and second stator. The example can include sensing motion of the die along a direction extending between the first portion of the proof-mass and the second portion of the proof-mass by measuring a differential in respective capacitance values for the first stator and the second stator.

Example 33 can include any of the preceding examples wherein the first portion includes a first proof-mass electrode that moves toward a first stator electrode of a first stator while the second portion includes a second proof-mass electrode that moves away from a second stator electrode of a second stator.

Example 34 can include any of the preceding examples wherein sensing motion includes sensing a differential between a first capacitance of a first electrode pair including the first proof-mass electrode and the first stator electrode, and a second electrode pair including the second proof-mass electrode and the second stator electrode.

Example 35 can include any of the preceding examples, including rotating the proof-mass, in the plane of the proof-mass, without changing the measured differential in respective capacitance values for the first stator and the second stator.

Example 36 can include any of the preceding examples, including rotating the proof-mass, in the plane of the proof-mass, without changing a distance between electrodes of the first electrode pair and without changing a distance between electrodes of the second electrode pair.

Example 37 can include any of the preceding claims including a microelectromechanical die for sensing motion. The example can include a fixed portion. The example can include an anchor coupled to the fixed portion. The example can include a first nonlinear suspension member coupled to anchor on a first side of the anchor. The example can include a second nonlinear suspension member coupled to the anchor on the first side of the anchor, the second nonlinear suspension member having a shape and location mirroring the first nonlinear suspension member about an anchor bisecting plane. According to the example, the first nonlinear suspension member and the second nonlinear suspension member are part of an inner gimbal of the microelectromechanical die. The example can include a proof-mass that is planar, the proof-mass suspended by a first suspension member disposed on a first side of the anchor and a second suspension member disposed on a second side of the anchor opposite the first side, with the die defining a first gap extending along a first side of the anchor and a second gap extending along a second side of the anchor, opposite the first side, with each of the first gap and the second gap extending between the inner gimbal and the proof-mass, wherein the inner gimbal is supported at least in part by the first nonlinear suspension member and the second nonlinear suspension member such that the proof-mass is rotable about the anchor and is slideable in a plane parallel to the fixed portion.

Example 38 can include any of the preceding claims, wherein the first gap extends from the first suspension member to the second suspension member, and the second gap extends from the first suspension member to the second suspension member.

Example 39 can include any of the preceding claims, wherein the first gap and the second gap are C-shaped, with a first C-shape defining a first opening that opens to a second opening of a second C-shape.

Example 40 can include any of the preceding claims, wherein the first gap defines a first vertical flexure and a second vertical flexure, and the second gap defines a third vertical flexure and a fourth vertical flexure.

Example 41 can include any of the preceding claims, wherein each of the first, second, third and fourth vertical flexures are elongate, with a length longer than a width, with each respective length extending away from a respective suspension member.

Example 42 can include any of the preceding claims, wherein each respective length extends away from the anchor bisecting plane.

Example 43 can include any of the preceding claims, wherein the first C-shape includes a first end portion and a second end portion, with a center portion extending between the first end portion and the second end portion.

Example 44 can include any of the preceding claims, wherein the first end portion and the second end portion are perpendicular to the center portion.

Example 45 can include any of the preceding claims, wherein a first canted portion extends between the first end portion and the center portion and a second canted portion extends between the second end portion and the center portion.

Example 46 can include any of the preceding claims, wherein the first gap is a mirrored shape of the second gap and the first gap is mirrored along the anchor bisecting plane.

Example 47 can include a method including forming a material to define an inner gimbal for coupling with an anchor for anchoring to a substrate. The example can include forming the material to define a first nonlinear suspension member coupled to anchor on a first side of the anchor. The example can include forming the material to define a second nonlinear suspension member coupled to the anchor on the first side of the anchor, the second nonlinear suspension member having a shape and location mirroring the first nonlinear suspension member about an anchor bisecting plane. The example can include forming the material to define a proof-mass that is planar, the proof-mass suspended by a first suspension member disposed on a first side of the anchor and a second suspension member disposed on a second side of the anchor opposite the first side, with a first gap extending along a first side of the anchor and a second gap extending along a second side of the anchor, opposite the first side, with each of the first gap and the second gap extending between the proof-mass and the inner gimbal.

Example 48 can include any of the preceding claims, wherein forming includes deep reactive-ion etching.

Example 49 can include any of the preceding claims, wherein the first nonlinear suspension member and the second nonlinear suspension member are part of a first set, comprising etching the material to define a second set of nonlinear suspension members opposite the first set.

Example 50 can include etching a third set of nonlinear suspension members for coupling the anchor to the proof-mass and etching a fourth set of nonlinear suspension members for coupling the anchor to the proof-mass Example can include any of the preceding claims, wherein the third set and the fourth set have a similar for factor to the first set and the second set and are bisected by a second anchor bisecting plane perpendicular the first.

Example 51 can include any of the preceding claims, wherein etching the first gap and the second gap includes forming each into a C-shape, with a first C-shape of the first gap opens to a second C-shape of the second gap.

Example 52 can include a method for sensing motion with a microelectromechanical die, comprising. The example can include rotating a proof-mass with respect to an inner gimbal that is coupled to a substrate via an anchor, by. The example can include deforming a first nonlinear suspension member, that couples the proof-mass to a first side of the anchor, out-of-plane of the plane of the proof-mass, above the proof-mass. The example can include deforming a second nonlinear suspension member, that couples the proof-mass to the first side of the anchor, out-of-plane of the plane of the proof-mass on an opposite first side of the plane of the proof-mass, below the proof-mass. The example can include deforming a first suspension member, that supports the proof-mass and that is disposed on a first side of the anchor, and a second suspension member, that is disposed on a second side of the anchor opposite the first side, with the die defining a first gap extending along a first side of the anchor and a second gap extending along a second side of the anchor, opposite the first side, with each of the first gap and the second gap extending between the inner gimbal and the proof-mass.

Example 53 can include any of the preceding claims, wherein deforming a first suspension member, that supports the proof-mass and that is disposed on a first side of the anchor, and a second suspension member, that is disposed on a second side of the anchor opposite the first side includes deforming a first vertical flexure and a second vertical flexure, each defined by the first gap, and a third vertical flexure and a fourth vertical flexure, each defined by the second gap.

Example 54 can include any of the preceding claims, wherein during a first half of a rotation cycle, the first and second vertical flexures are deformed away from the anchor, and the third and fourth vertical flexure are deformed toward the anchor, and during a second half of a rotation cycle, the first and second vertical flexures are deformed toward from the anchor, and the third and fourth vertical flexure are deformed away the anchor.

Example 55 can include any of the preceding claims, wherein deforming of the flexures includes bending.

Example 56 can include any of the preceding claims, wherein an anchor bisecting plane bisects the anchor vertically and passes between the first and second nonlinear suspension members, between the first and second suspension members.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. The above description is intended to be illustrative, and not restrictive. In other examples, the above-described examples (or one or more aspects thereof) may be used in combination with each other. Other embodiments can be used, such as by one of ordinary skill in the art upon reviewing the above description.

The Abstract is provided to comply with 37 C.F.R. §1.72 (b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A microelectromechanical die for sensing motion, comprising:
   a substrate;
   a proof-mass coupled to the substrate at an anchor, the proof-mass including:
      a first portion moveable with respect to the anchor, the first portion including a first proof-mass electrode; and
      a second portion, opposite the first portion with respect to the anchor, the second portion moveable with respect to the anchor and the first portion, the second portion including a second proof-mass electrode;
   a first stator coupled to the substrate and including a first stator electrode extending alongside the first proof-mass electrode of the first portion of the proof-mass to form a first electrode pair; and
   a second stator coupled to the substrate and including a second stator electrode, opposite the first stator electrode, and extending alongside the second proof-mass electrode of the second portion of the proof-mass to form a second electrode pair;
   wherein in a first vibratory mode, in which the first portion of the proof-mass is to move away from the second portion of the proof-mass, the proof-mass, the first stator electrode, and the second stator electrode are arranged such that a distance between electrodes of the first electrode pair is inversely proportional to a distance between electrodes of the second electrode pair.

2. The die of claim 1, wherein the first proof-mass electrode of the proof-mass is opposite the second proof-mass electrode of the proof-mass, across the anchor and wherein the first stator electrode is coupled to the substrate opposite the second stator electrode, across the anchor.

3. The die of claim 1, wherein the first portion of the proof-mass is symetrical, across the anchor, with the second portion of the proof-mass, and the first stator is asymmetrical, across the anchor, with respect to the second stator.

4. The die of claim 1, wherein the first electrode pair comprises a first capacitor, and the second electrode pair comprises a second capacitor.

5. The die of claim 1, wherein each of the first proof-mass electrode and the first stator electrode are elongate, with a distance between the first proof-mass electrode and the first stator electrode being substantially constant along the length of each., wherein each of the second proof-mass electrode and the second stator electrode are elongate, with a distance between the second proof-mass electrode and the second stator electrode being substantially constant along the length of each.

6. The die of claim 1, wherein the proof-mass defines
   a first opening on a first side of the anchor, with the first portion of the proof-mass moveably coupled therein, with a first plurality of proof-mass electrodes, including the first proof-mass electrode, extending into the opening, spaced apart from one another; and
   a second opening on a second side of the anchor, with the second portion coupled therein, with a second plurality of proof-mass electrodes, including the second proof-mass electrode, extending into the opening, spaced apart from one another.

7. The die of claim 6, wherein the first stator electrode is one of a first plurality of stator electrodes interdigitated and paired with respective ones of the first plurality of proof-mass electrodes to form the first electrode pair; and wherein the second stator electrode is one of a second plurality of stator electrodes interdigitated and paired with respective ones of the second plurality of stator electrodes to form the second electrode pair.

8. The die of claim 7, wherein, in the first vibratory mode, the first plurality of stator electrodes is configured to move away from the first plurality of stator electrodes and away from the anchor while the second plurality of stator electrodes is configured to move toward the the second plurality of stator electrodes and toward the anchor.

9. The die of claim 8, wherein the proof-mass is configured to vibrate with respect to the substrate to vary the distances between the first plurality of stator electrodes and the first plurality of stator electrodes and to vary the distances between the second plurality of stator electrodes and the second plurality of stator electrodes, with one of the first plurality of stator electrodes, closest to the anchor, being a distance from one of the first plurality of stator electrodes, closest to the anchor, when one of the second plurality of stator electrodes, closest to the anchor, is a greater distance from one of the second plurality of stator electrodes, closest to the anchor.

10. The die of claim 1, wherein the first proof-mass electrode, the second proof-mass electrode, the first stator electrode and the second stator electrode are curved, wherein each of the electrodes curves around an axis around which the proof-mass is configured to rotate in a second vibratory mode.

11. A method for sensing motion with a microelectromechanical die, comprising:
 exciting vibration of a first portion of a proof-mass and a second portion of the proof-mass so the first portion and the second portion move together and apart in synchrony, toward a respective first stator and second stator; and
 sensing motion of the die along a direction extending between the first portion of the proof-mass and the second portion of the proof-mass by measuring a differential in respective capacitance values for the first stator and the second stator.

12. The method of claim 11, wherein the first portion includes a first proof-mass electrode that moves toward a first stator electrode of a first stator while the second portion includes a second proof-mass electrode that moves away from a second stator electrode of a second stator.

13. The method of claim 12, wherein sensing motion includes sensing a differential between a first capacitance of a first electrode pair including the first proof-mass electrode and the first stator electrode, and a second electrode pair including the second proof-mass electrode and the second stator electrode.

14. The method of claim 11, including rotating the proof-mass, in the plane of the proof-mass, without changing the measured differential in respective capacitance values for the first stator and the second stator.

15. The method of claim 14, including rotating the proof-mass, in the plane of the proof-mass, without changing a distance between electrodes of a first electrode pair including the first proof-mass electrode and the first stator electrode, and without changing a distance between electrodes of a second electrode pair including the second proof-mass electrode and the second stator electrode.

* * * * *